(12) United States Patent
Tokuyama et al.

(10) Patent No.: US 9,307,666 B2
(45) Date of Patent: Apr. 5, 2016

(54) ELECTRIC CIRCUIT DEVICE, ELECTRIC CIRCUIT MODULE, AND POWER CONVERTER

(71) Applicant: Hitachi, Ltd., Chiyoda-ku, Tokyo (JP)

(72) Inventors: Takeshi Tokuyama, Hitachi (JP); Kinya Nakatsu, Hitachinaka (JP); Atushi Kawabata, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 153 days.

(21) Appl. No.: 14/261,626

(22) Filed: Apr. 25, 2014

(65) Prior Publication Data

US 2014/0233204 A1    Aug. 21, 2014

Related U.S. Application Data

(63) Continuation of application No. 13/241,600, filed on Sep. 23, 2011, now Pat. No. 8,743,548, which is a continuation of application No. 12/715,025, filed on Mar. 1, 2010, now Pat. No. 8,081,472, which is a continuation of application No. 11/740,622, filed on Apr. 26, 2007, now Pat. No. 7,961,472.

(30) Foreign Application Priority Data

Apr. 27, 2006   (JP) ................................. 2006-123835

(51) Int. Cl.
*H05K 7/20*   (2006.01)
*H05K 7/02*   (2006.01)
*H02M 7/00*   (2006.01)

(52) U.S. Cl.
CPC ................ *H05K 7/02* (2013.01); *H02M 7/003* (2013.01); *H01L 2224/32245* (2013.01);

(Continued)

(58) Field of Classification Search
CPC ......... H05K 7/20; H05K 7/2089; H01L 24/33
See application file for complete search history.

(56) References Cited

U.S. PATENT DOCUMENTS 4,390,219 A   6/1983 Beehler
4,739,447 A   4/1988 Lecomte
(Continued)

FOREIGN PATENT DOCUMENTS

EP   0 577 916 A2   10/1995
EP   1 172 850 A2   1/2002
(Continued)

OTHER PUBLICATIONS

European Search Report dated Jun. 13, 2008 (five -5- pages).

(Continued)

*Primary Examiner* — Gregory Thompson
(74) *Attorney, Agent, or Firm* — Crowell & Moring LLP

(57) ABSTRACT

The present invention provides an electric circuit device in which it is possible to achieve simultaneously the improvement of cooling performance and reduction in operating loss due to line inductance. The above object can be attained by constructing multiple plate-like conductors so that each of these conductors electrically connected to multiple semiconductor chips is also thermally connected to both chip surfaces of each such semiconductor chip to release heat from the chip surfaces of each semiconductor chip, and so that among the above conductors, a DC positive-polarity plate-like conductor and a DC negative-polarity plate-like conductor are opposed to each other at the respective conductor surfaces.

6 Claims, 30 Drawing Sheets

(52) U.S. Cl.
CPC ........... *H01L 2224/45124* (2013.01); *H01L 2224/48091* (2013.01); *H01L 2224/48247* (2013.01); *H01L 2224/73215* (2013.01); *H01L 2224/73265* (2013.01); *H01L 2924/1305* (2013.01); *H01L 2924/13055* (2013.01); *H01L 2924/13091* (2013.01); *H01L 2924/3025* (2013.01); *H01L 2924/30107* (2013.01)

(56) References Cited

U.S. PATENT DOCUMENTS

| | | | |
|---|---|---|---|
| 5,132,896 | A | 7/1992 | Nishizawa et al. |
| 5,258,994 | A | 11/1993 | Haruta et al. |
| 5,347,158 | A | 9/1994 | Matsuda et al. |
| 5,347,160 | A | 9/1994 | Sutrina |
| 5,523,620 | A | 6/1996 | Eytcheson et al. |
| 5,539,254 | A | 7/1996 | Eytcheson et al. |
| 5,671,134 | A | 9/1997 | Nomura et al. |
| 5,694,301 | A | 12/1997 | Donegan et al. |
| 5,940,263 | A | 8/1999 | Jakoubovitch |
| 6,054,765 | A | 4/2000 | Eytcheson et al. |
| 6,072,240 | A | 6/2000 | Kimura et al. |
| 6,127,727 | A | 10/2000 | Eytcheson |
| 6,304,448 | B1 | 10/2001 | Fukada et al. |
| 6,313,598 | B1 | 11/2001 | Tamba et al. |
| 6,326,761 | B1 | 12/2001 | Tareilus |
| 6,493,249 | B2 | 12/2002 | Shirakawa et al. |
| 6,525,950 | B1 | 2/2003 | Shirakawa et al. |
| 6,528,880 | B1 | 3/2003 | Planey |
| 6,618,278 | B2 | 9/2003 | Suzuki et al. |
| 6,697,257 | B1 | 2/2004 | Wolf et al. |
| 6,721,181 | B1 | 4/2004 | Pfeifer et al. |
| 6,791,854 | B2 | 9/2004 | Shirakawa et al. |
| 6,843,335 | B2 | 1/2005 | Shirakawa et al. |
| 6,873,045 | B2 | 3/2005 | Yoshizaki et al. |
| 6,933,593 | B2 | 8/2005 | Fissore et al. |
| 6,963,133 | B2 | 11/2005 | Teshima |
| 6,998,707 | B2 | 2/2006 | Fukuda et al. |
| 7,009,842 | B2 | 3/2006 | Tilton et al. |
| 7,148,562 | B2 | 12/2006 | Yoshida et al. |
| 7,403,393 | B2 | 7/2008 | Herring et al. |
| 7,633,758 | B2 | 12/2009 | Oohama |
| 7,724,523 | B2 | 5/2010 | Ishiyama |
| 2001/0050421 | A1 | 12/2001 | Kono |
| 2002/0006685 | A1 | 1/2002 | Petitbon et al. |
| 2002/0034087 | A1 | 3/2002 | Suzuki et al. |
| 2002/0089056 | A1 | 7/2002 | Eady et al. |
| 2002/0158329 | A1 | 10/2002 | Kimura et al. |
| 2002/0180037 | A1 | 12/2002 | Shirakawa et al. |
| 2002/0195286 | A1 | 12/2002 | Shirakawa et al. |
| 2003/0067748 | A1 | 4/2003 | Tamba et al. |
| 2003/0067749 | A1 | 4/2003 | Tamba et al. |
| 2003/0142480 | A1 | 7/2003 | Spitz et al. |
| 2004/0060692 | A1 | 4/2004 | Pfeifer et al. |
| 2004/0113268 | A1 | 6/2004 | Shirakawa et al. |
| 2005/0057099 | A1 | 3/2005 | Flock |
| 2005/0128706 | A1 | 6/2005 | Maly et al. |
| 2005/0152101 | A1 | 7/2005 | Rodriguez et al. |
| 2005/0161809 | A1 | 7/2005 | Nakatsu et al. |
| 2006/0061937 | A1 | 3/2006 | Takemoto et al. |
| 2006/0086981 | A1* | 4/2006 | Yamaguchi ........... H02M 7/003 257/347 |
| 2006/0232942 | A1 | 10/2006 | Nakatsu et al. |
| 2006/0273592 | A1 | 12/2006 | Yamabuchi et al. |
| 2006/0284308 | A1 | 12/2006 | Harada et al. |
| 2007/0096278 | A1 | 5/2007 | Nakatsu et al. |
| 2007/0183130 | A1 | 8/2007 | Yamabuchi et al. |
| 2008/0164607 | A1 | 7/2008 | Harada et al. |
| 2008/0239663 | A1 | 10/2008 | Yamamoto et al. |
| 2009/0160048 | A1 | 6/2009 | Nakatsu et al. |
| 2010/0188813 | A1 | 7/2010 | Nakatsu et al. |

FOREIGN PATENT DOCUMENTS

| | | |
|---|---|---|
| EP | 1 195 884 A2 | 4/2002 |
| EP | 1 480 340 A2 | 11/2004 |
| JP | 10-248266 A | 9/1998 |
| JP | 2004-193476 A | 7/2004 |
| JP | 2004-208411 A | 7/2004 |
| JP | 2004-297033 A | 10/2004 |
| JP | 2005-19459 A | 1/2005 |
| JP | 2005-26627 A | 1/2005 |
| JP | 2005-45120 A | 2/2005 |
| JP | 2005-45185 A | 2/2005 |
| JP | 2005-45960 A | 2/2005 |
| JP | 2005-176555 A | 6/2005 |
| JP | 2007-35670 A | 2/2007 |

OTHER PUBLICATIONS

Chinese Office Action dated Jan. 23, 2009 including English translation (Eight (8) pages).
European Search Report dated Jan. 4, 2011 (Six (6) pages).

* cited by examiner

ELECTRIC CIRCUIT DEVICE, ELECTRIC CIRCUIT MODULE, AND POWER CONVERTER

RELATED APPLICATIONS

This application is a continuation of U.S. patent application Ser. No. 13/241,600, filed Sep. 23, 2011, the disclosure of which is incorporated herein in its entirety and the priority of which is claimed under 35 U.S.C. §120, which is a continuation of U.S. patent application Ser. No. 12/715,025, filed Mar. 1, 2010, now U.S. Pat. No. 8,081,472, the disclosure of which is incorporated herein in its entirety and the priority of which is claimed under 35 U.S.C. §120, which, in turn, is a continuation of U.S. patent application Ser. No. 11/740,622, filed Apr. 26, 2007, now U.S. Pat. No. 7,961,472, the priority of which is claimed under 35 U.S.C. §120 and the disclosure of which is incorporated herein in its entirety, which, in turn, claims the benefit of priority under 35 U.S.C. §119 to Japanese patent application serial no. 2006-123835, filed Apr. 27, 2006, the disclosure of which is incorporated herein in its entirety, the priority of which is also claimed in the present application.

BACKGROUND OF THE INVENTION

1. Field of the Invention

The present invention relates to an electric circuit device adapted to configure an electric circuit that uses semiconductors, an electric circuit module with the device mounted therein, and an electric power converter having the module.

2. Description of the Related Art

Known techniques related to an electric circuit device adapted to configure an electric circuit that uses semiconductors, an electric circuit module having the device mounted therein, and an electric power converter having the module, are described in JP-A-2004-208411, JP-A-2004-193476, and JP-A-10-248266, for example. JP-A-2004-208411 discloses the technique for sandwiching high-side semiconductor chips (IGBT chip and diode chip) and low-side semiconductor chips (IGBT chip and diode chip) by use of a common middle-side plate and high-side plate and a common middle-side plate and low-side plate, respectively, and cooling each of the semiconductor chips from both sides.

Also, JP-A-2004-193476 discloses the technique for arranging an IGBT element and a diode element between a P-side electrode, a middle electrode, and an N-side electrode, and stacking these elements in a longitudinal direction for reduced line inductance.

Additionally, JP-A-10-248266 discloses the technique for arranging a semiconductor module and a smoothing capacitor vertically, electrically connecting these elements via two pairs of connection conductors that are a stacked structure of thin plates each fastened at one end to the terminal sections of the module and the capacitor, connected at the other end to each other with the same polarity, and formed with an insulating member sandwiched between heteropolar conductors, and shortening a line distance between the module and the capacitor in order to reduce line inductance therebetween.

SUMMARY OF THE INVENTION

In recent years, development of electric driving has been accelerated in various industries. In automobiles, for example, electric driving in various systems for installation in the vehicle, including a vehicular driving system, is increasing in terms of improvement of the vehicle in fuel efficiency and protection of the global environment. Further acceleration of such electric driving is recently desired. To electrically drive a vehicle-mounted system, however, it becomes necessary to add an electric machine that drives a mechanism to be driven, and an electric power converter that controls driving of a rotary electric machine by controlling the electric power supplied from a vehicle-mounted power supply to the rotary electric machine, as well as to adopt substitutes for the conventional system components. For further accelerated electric driving of the vehicle-mounted system, therefore, the electric machine and its controller require further improvement in mountability and further reduction in price.

The electric machine and the electric power converter must be further miniaturized to implement their further improvement in mountability and their further reduction in price. One possible method of achieving further miniaturization of the power converter is to construct an electric circuit device by use of smaller semiconductor chips to form a power conversion circuit and then mount the electric circuit device in a more compact electric circuit module. However, semiconductor chips generate a large amount of heat during an electrical conducting state, and as the chips are dimensionally reduced, they correspondingly increase in heat capacity and hence in the amount of heat generated. The amount of heat generated by the semiconductor chips is also increased by the internal line inductance of the electric circuit device and by electrical loss due to the line inductance occurring at the input side of the electric circuit device during operation. Accordingly, further improvement of the electric circuit device in cooling performance and further reduction of the operating loss due to the line inductance become important technical factors in miniaturizing the power converter.

In particular, to miniaturize the power converter exposed to a severe operating/mounting environment, for example, to miniaturize the power converter used in the driving system of an automobile, it is absolutely necessary to simultaneously realize further improvement of the electric circuit device in cooling performance and further reduction of the operating loss due to the line inductance.

In this context, as disclosed in the three JP-A publications, the effectiveness of the conventional techniques is confined only to either the improvement of the electric circuit device in terms of cooling performance or the reduction of the operating loss due to the line inductance. At present, therefore, the conventional techniques are not as effective as they can attain both of the above two factors.

The present invention typically provides an electric circuit device that can attain improvement of its cooling performance and reduction of its operating loss due to line inductance.

In the electric circuit device of the present invention, a plurality of plate-shaped conductors electrically connected to a plurality of semiconductor chips are typically constructed so that each plate-shaped conductor is thermally connected to both sides of each semiconductor chip in order to make it possible to release heat from both chip surfaces of each semiconductor chip via the plate-shaped conductor. The plate-shaped conductors are also typically constructed so that among the multiple plate-shaped conductors, only a plate-shaped conductor for DC positive polarity and a plate-shaped conductor for DC negative polarity are opposed to each other at respective conductor surface.

According to the present invention having the above features, heat generated by each semiconductor chip can be released to the outside of the device via the plate-shaped conductors thermally connected to both sides of the semiconductor chip, so the semiconductor chip itself can be cooled from both sides thereof. In addition, according to the present invention, when currents of equal magnitude flow into the plate-shaped conductor for DC positive polarity and the plate-shaped conductor for DC negative polarity, directions of the currents can be changed to opposite directions at opposed sections of the two plate-shaped conductors. Thus, a magnetic field generated by the current flowing through the plate-shaped conductor for DC positive polarity can be offset by a magnetic field generated by the current flowing through the plate-shaped conductor for DC negative polarity. Hence, according to the present invention, the line inductance occurring in the electric circuit device can be reduced and this, in turn, makes it possible to reduce the operating loss of the semiconductor due to line inductance. According to the present invention, therefore, the improvement of cooling performance and the reduction of the operating loss due to the line inductance can be realized at the same time.

The present invention also provides an electric circuit module that uses an electrical insulating structure to mount the above electric circuit device on a heat release structure having a surface cooled by a cooling medium.

In addition, the present invention provides an electric power converter that includes the above electric circuit module, a controller for controlling an operational state of the electric circuit module, and a capacitor device electrically connected to an electric power conversion circuit composed of the electric circuit module.

According to the present invention summarized above, since the improvement of cooling performance and the reduction of the operating loss due to line inductance can be realized at the same time, a more compact electric circuit device can be constructed using smaller semiconductor chips.

According to the present invention, since the above electric circuit device is mounted, it is also possible to construct a more compact electric circuit module.

In addition, according to the present invention, since the above electric circuit module is mounted, it is possible to construct a more compact electric power converter and thus to contribute to improving the power converter in mountability and reducing a price of the power converter. The present invention yields advantageous effects particularly significant in the power converter mounted in an automobile.

DETAILED DESCRIPTION OF THE PREFERRED EMBODIMENTS

Figure 1:
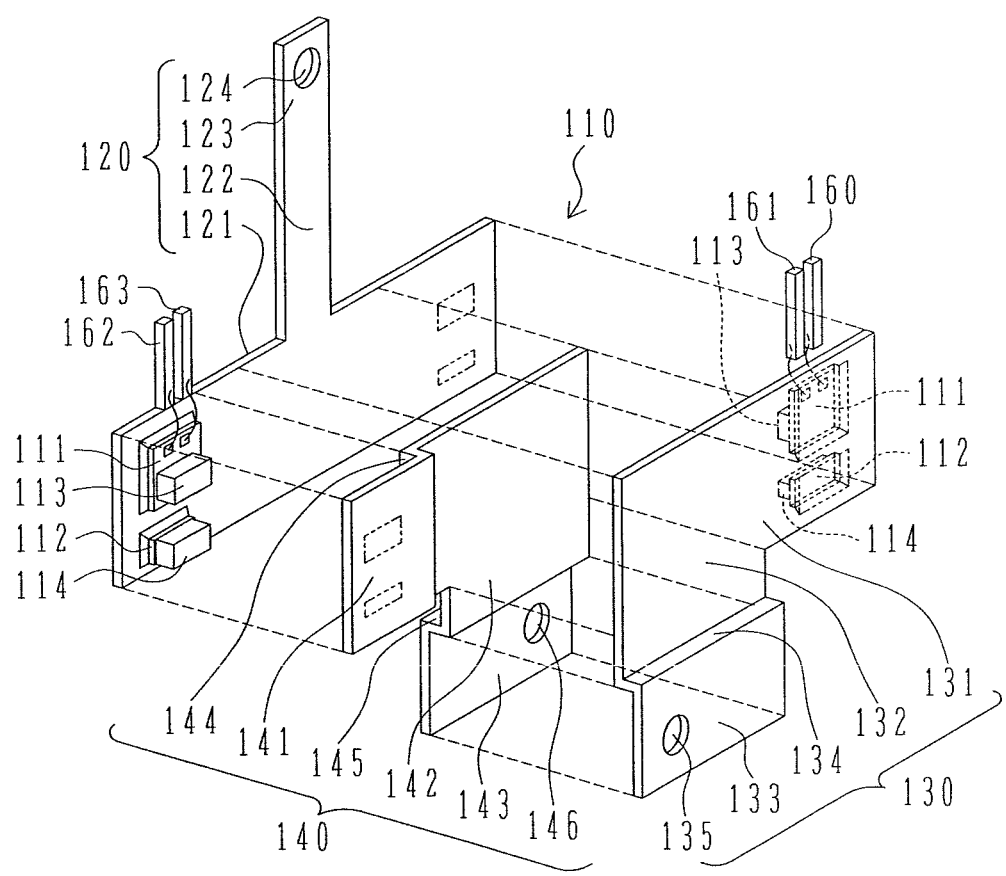
FIG. 1 is an exploded perspective view showing an internal configuration of an electric circuit device according to a first embodiment of the present invention.
Figure 2:
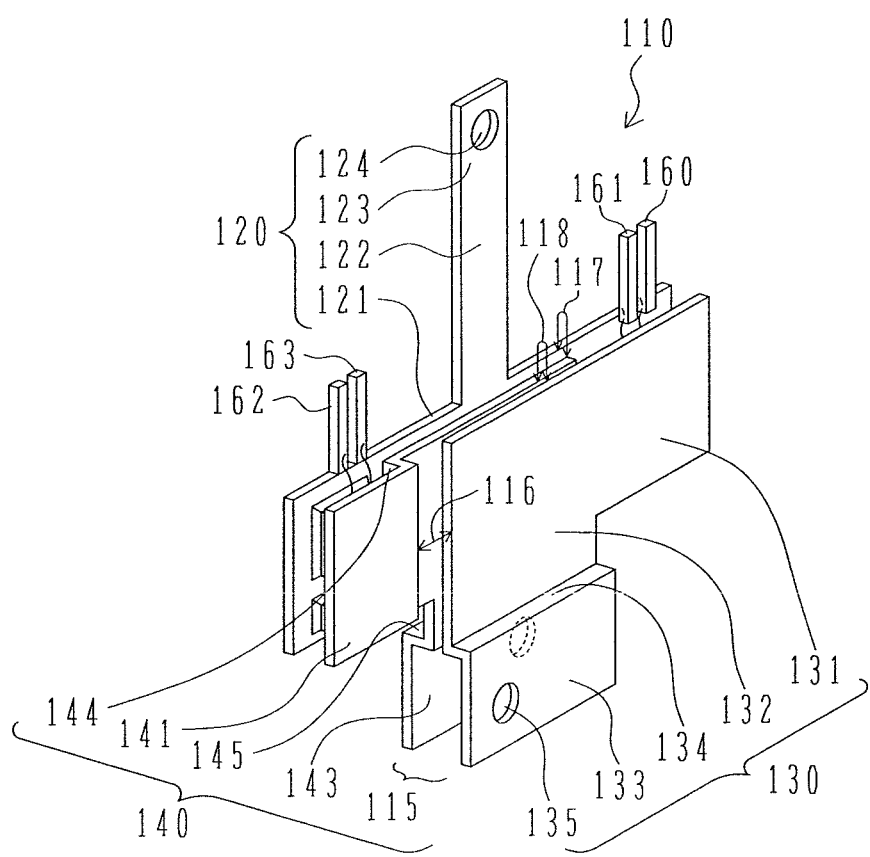
FIG. 2 is an assembly perspective view of FIG. 1.

Embodiments of the present invention will be described hereunder in accordance with the accompanying drawings.

Examples of applying the present invention to a vehicular electric power converter of a vehicular electric machine system mounted in an automobile, and more particularly, to a vehicular driving inverter used in a vehicular electric machine system and exposed to very severe environments such as a mounting environment and an operating environment, will be described hereunder as the embodiments below. The vehicular electric power inverter disposed in an vehicular electric machine system as a controller to control driving of a vehicular driving motor transforms DC power supplied from a vehicle-mounted battery or vehicle-mounted power generator constituting a vehicle-mounted power supply, into required AC power and then supplies the AC power to the vehicular driving motor to control the driving thereof.

The configuration described below can also be applied to inverters constructed for purposes other than vehicle driving, for example, an inverter used as a controller of an electric braking device or electric power steering device. In addition, the configuration below can be applied to DC-DC power converters such as a DC-DC converter and a DC chopper, to AC-DC power converters, or to other vehicular power converters. Furthermore, the configuration below can be applied to industrial power converters used as controllers of motors which drive factory equipment, or to household power converters used in controllers of motors which drive household solar light power-generating systems or electrical household appliances. For improved mountability and reduced price of an electric power converter, application to a more compact converter, in particular, is preferable.

Also, the embodiments below will be described hereunder taking an example in which a vehicular driving electric machine system with a vehicular driving inverter applying the present invention is mounted in a hybrid automobile that employs an internal-combustion engine and a vehicular driving motor as driving sources of a vehicle and is constructed so as to drive either one of two pairs of front or rear wheels of the vehicle. Some kinds of hybrid automobiles use an engine to drive either one of two pairs of front or rear wheels and a vehicular driving motor to drive the other pair of front or rear wheels. The vehicular driving electric machine system in any one of the embodiments can also be applied to the hybrid automobile constructed in that way.

The vehicular driving electric machine system can be further applied to a pure electric automobile constructed so as to drive either front or rear wheels by using a vehicular driving motor as a driving source of the vehicle. Furthermore, the vehicular electric machine system with the vehicular inverter applying the present invention can be applied to a simplified hybrid automobile adapted to use an internal-combustion engine as a driving source of the vehicle to drive either the front or rear wheels and use the vehicular electric machine system to start the engine or to provide engine power assistance for the engine start and for accelerated engine operation. Moreover, the vehicular electric machine system with the vehicular inverter applying the present invention can be applied to an automobile adapted to use an internal-combustion engine as a driving source of the vehicle to drive either the front or rear wheels and to have a vehicle-mounted electric machine system such as an electric braking device and an electric power steering device.

First Embodiment

Hereunder, a first embodiment of the present invention will be described in accordance with FIGS. 1 to 20.

Figure 20:
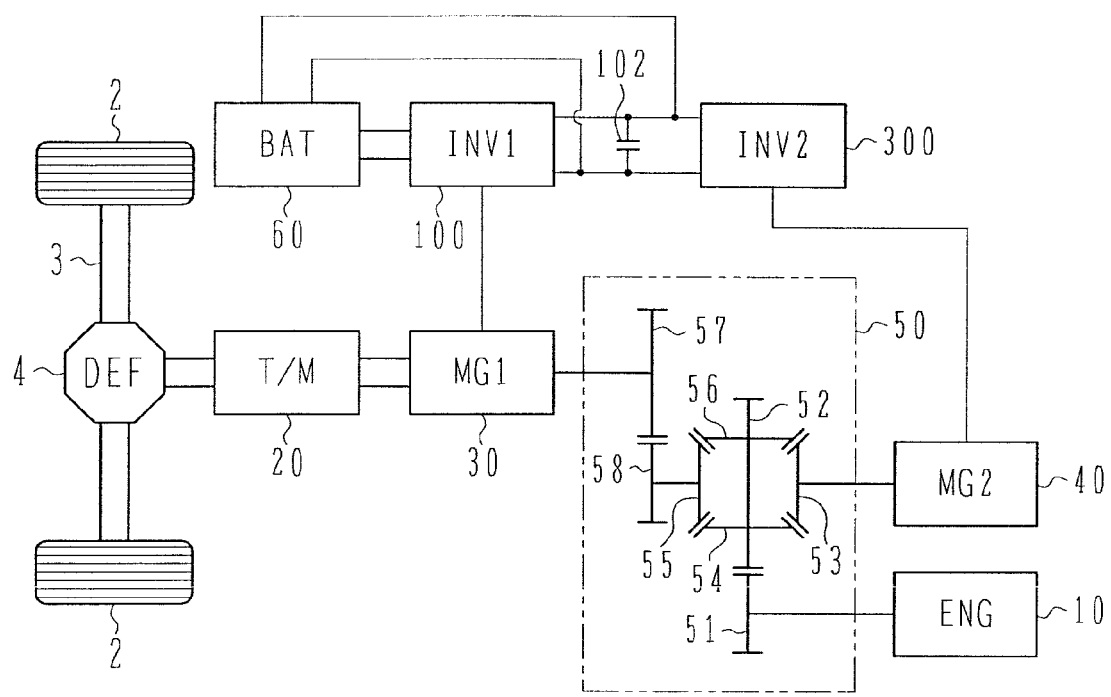
FIG. 20 is a block diagram showing a hybrid automobile configuration according to the first embodiment of the present invention.

First, a configuration of a hybrid electric automobile 1 is described below using FIG. 20.

The hybrid electric automobile (hereinafter, referred to as HEV) 1 of the present embodiment is one electric vehicle and has two vehicular driving systems. One of them is an engine system that uses an internal-combustion engine 10 as a motive power source. The engine system is used as a driving source of the HEV. The other is a vehicular electric machine system that use motor generators 30, 40 as motive power sources. The vehicular electric machine system is primarily used as another driving source of the HEV and as an electric power generator for the HEV.

At a front section of a vehicle body (not shown), front wheel axles 3 are axially supported so as to be rotatable. One pair of front wheels 2 are disposed at both ends of each front wheel axle 3. At a rear section of the vehicle body, rear wheel axles (not shown) are axially supported so as to be rotatable. One pair of rear wheels (not shown) are disposed at both ends of each rear wheel axle. The HEV of the present embodiment employs a so-called front wheel drive scheme. In this scheme, the front wheels 2 operate as main wheels driven by motive power, and the rear wheels operate as trailing wheels simultaneously rotated by movements of the front wheels 2. The HEV, however, may employ the inverse of the above, that is, a rear wheel drive scheme.

A front wheel differential gear 4 (hereinafter, referred to as a front wheel DEF) is provided centrally between the front wheel axles 3. The front wheel axles 3 are mechanically connected to an output side of the front wheel DEF 4. A transmission 20 is mechanically connected at its output shaft to an input side of the front wheel DEF 4. The front wheel DEF 4 is a differential motive power distributor that distributes rotational driving force to the left and right front wheel axles 3 after the rotational driving force has been transmitted from the transmission 20 as a result of a gearshift thereby. The motor generator 30 is mechanically connected at its output side to an input side of the transmission 20. The engine 10 and the motor generator 40 are mechanically connected at respective output sides to an input side of the motor generator 30 via the motive power distributor 50.

The motor generators 30, 40 and the motive power distributor 50 are stored within an enclosure of the transmission 20.

The motive power distributor 50 is a differential mechanism constituted by gears 51 to 58. The gears 53 to 56 are bevel gears. The gears 51, 52, 57, 58 are spur gears. Motive power of the motor generator 30 is transmitted directly to the transmission 20. A shaft of the motor generator 30 is coaxial with the gear 57. In this configuration, when electric power for driving is not supplied to the motor generator 30, motive power that has been transmitted to the gear 57 is further transmitted intact to the input side of the transmission 20. When the gear 51 is driven by operation of the engine 10, motive power of the engine 10 is transmitted from the gear 51 to the gear 52, then from the gear 52 to the gears 54 and 56, and from the gears 54 and 56 to the gear 58. Finally, the power is transmitted to the gear 57. When the gear 53 is driven by operation of the motor generator 40, rotation of the motor generator 40 is transmitted first from the gear 53 to the gears 54 and 56, and then from the gears 54 and 56 to the gear 58. Finally, the rotation is transmitted to the gear 57.

Instead of the above differential mechanism, an epicyclic gear train or any other appropriate mechanism may be used as the motive power distributor 50.

The motor generator 30 (40) is a synchronous machine having a permanent magnet in a rotor section.

Alternating-current power supplied to an armature winding assembly 31 (41) of a stator is controlled by an inverter 100 (300), whereby driving is controlled. A battery 60 is electrically connected to the inverter 100 (300), and electric power can be exchanged reciprocally between the battery 60 and the inverter 100 (300).

The present embodiment includes a first motor electric power generator unit consisting essentially of the motor generator 30 and the inverter 100, and a second motor electric power generator unit consisting essentially of the motor generator 40 and the inverter 300, and either of the two motor electric power generator units is selectively used according to a particular operating state. That is to say, for vehicle drive torque assistance during vehicle driving by the motive power transmitted from the engine 10, the second motor electric power generator unit is activated as an electric power generator unit to generate electric power using the motive power of the engine 10, and the electric power that has thus been obtained operates the first motor electric power generator unit as an electric driving unit. In addition, for vehicle speed assistance in a case similar to the above, the first motor electric power generator unit is activated as an electric power generator unit to generate electric power using the motive power of the engine 10, and the electric power that has thus been obtained operates the second motor electric power generator unit as the electric driving unit.

Additionally, in the present embodiment, operating the first motor electric power generator unit as the electric driving unit by the power of the battery 60 makes the vehicle drivable only by the motive power of the motor generator 30.

Furthermore, in the present embodiment, the battery 60 can be recharged using electric power generated by operating the first motor electric power generator unit or the second motor electric power generator unit as the electric power generator unit by use of the motive power of the engine 10 or the motive power transmitted from the wheels.

Figure 19:
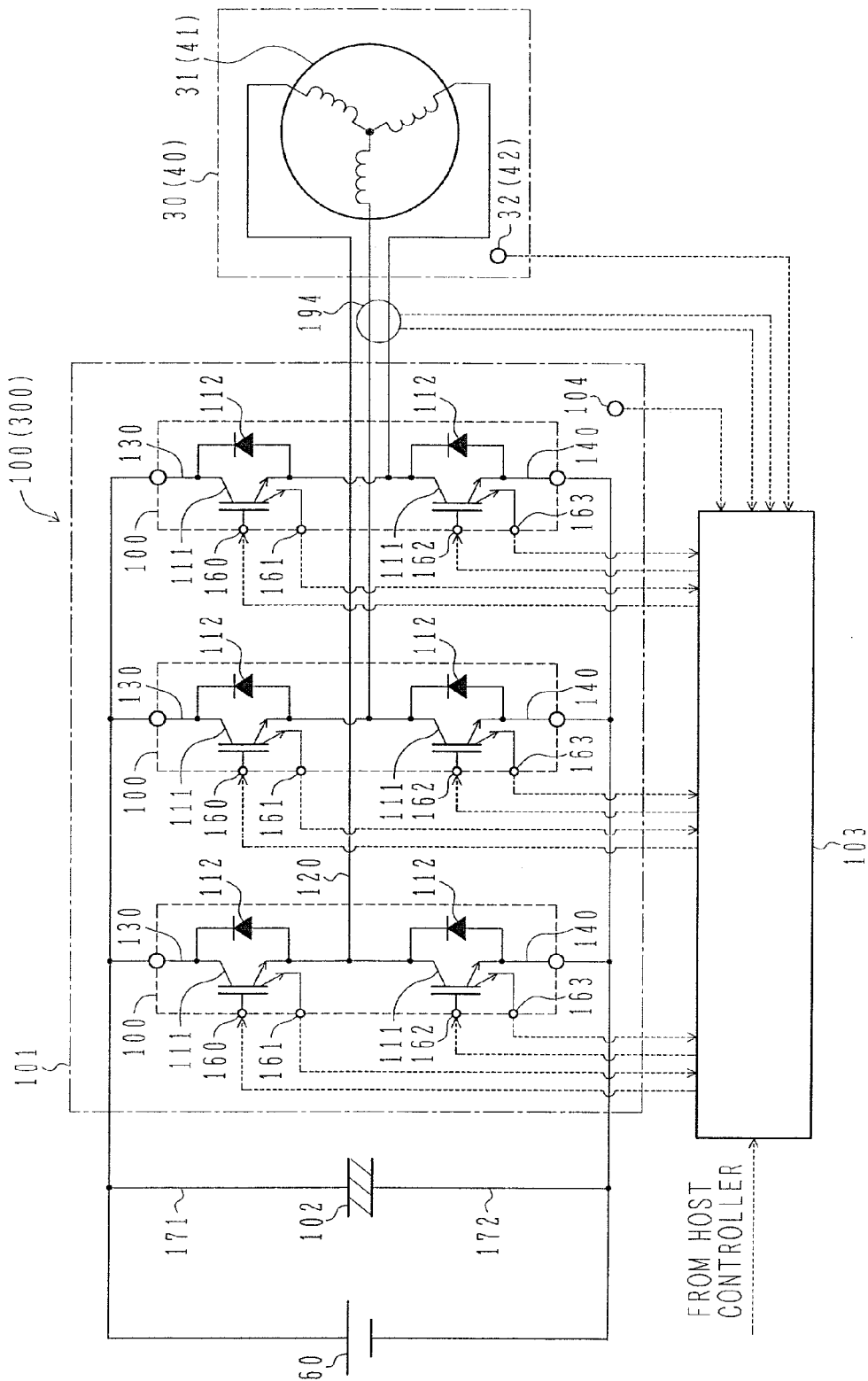
FIG. 19 is a circuit diagram showing a circuit configuration of the inverter according to the first embodiment of the present invention.

Next, electric circuit configurations of the inverters 100, 300 will be described hereunder using FIG. 19.

While the present embodiment is described below using an example of constructing the inverters 100, 300 independently, the inverters 100, 300 may be integrated to construct one inverter unit.

In addition, in the present embodiment, an electric power system and a signal system are shown with a solid line and a dotted line, respectively, to make the electric power system and the signal system readily distinguishable.

The inverter 100 (300) includes a semiconductor module 101, a capacitor 102, and a controller 103.

The semiconductor module 101 constitutes a main circuit for electric power conversion and has a plurality of switching power semiconductor elements. The plurality of switching power semiconductor elements operate under a driving signal output from the controller 103, and convert the DC power supplied from the battery 60, into three-phase AC power. The thus-converted power is supplied to the armature winding assembly 31 (41) of the motor generator 30 (40). The main circuit for electric power conversion is composed of a three-phase bridge circuit, and series circuits for three phases are each formed by electrical connection between a positive side and negative side of the battery 60. The series circuits are also called arms, which are constructed of the switching power semiconductor element for an upper arm and the switching power semiconductor element for a lower arm.

The present embodiment uses insulated gate bipolar transistors (IGBTs) 111 as the switching power semiconductor elements. Each IGBT 111 has a collector electrode, an emitter electrode, and a gate electrode. A diode 112 is electrically connected between the collector electrode and emitter electrode of the IGBT 111. The diode 112 has a cathodic electrode and an anodic electrode, and the cathodic electrode and the anodic electrode are electrically connected to the collector electrode and emitter electrode, respectively, of the IGBT 111 so that a direction in which a current flows from the emitter electrode of the IGBT 111 towards the collector electrode thereof becomes a forward direction.

Metal-oxide semiconductor field effect transistors (MOSFETs) may be used as the switching power semiconductor elements. Each MOSFET has a drain electrode, a source electrode, and a gate electrode.

Between its source electrode and its drain electrode, the MOSFET includes a parasitic diode adapted so that a direction in which a current flows from the drain electrode towards the source electrode becomes a forward direction. Accordingly, unlike an IGBT, there is no need to provide an independent diode.

Arms for three phases are provided in association with phase windings of the armature winding assembly 31 (41) in the motor generator 30 (40). The source electrode of the IGBT 111 and the drain electrode thereof are electrically interconnected in series via an intermediate electrode 120, whereby each of the arms is constructed. The drain electrode of the IGBT 111 in the upper arm of the arms is electrically connected to a positive-polarity capacitor electrode 171 of the capacitor device 102 via a positive-polarity electrode 130, and the source electrode of the IGBT 111 in the lower arm of the three arms is electrically connected to a negative-polarity capacitor electrode 172 of the capacitor device 102 via a negative-polarity electrode 140. The intermediate electrode 120 equivalent to a midpoint section between the three arms (i.e., a connection between the source electrode of the IGBT 111 in the upper arm and the drain electrode of the IGBT 111 in the lower arm) is electrically connected to the appropriate phase winding of the armature winding assembly 31 (41) in the motor generator 30 (40). In the present embodiment, as will be detailed later herein, one arm is constructed using one electric circuit device (semiconductor device) 110.

The capacitor device 102 constitutes a smoothing circuit that suppresses changes in DC voltage due to switching operation of the IGBT 111. A positive-polarity side and negative-polarity side of the battery 60 are electrically connected to the positive-polarity capacitor electrode 171 and negative-polarity capacitor electrode 171 of the capacitor device 102, respectively. Thus, between a DC side (input side) of the semiconductor module 101 and the battery 60, the capacitor device 102 is electrically connected in parallel to both the DC side of the semiconductor module 101 (i.e., between the respective positive-polarity electrodes 130 and negative-polarity electrodes 140 of the three arms) and the battery 60.

The controller 103 for operating the IGBT 111 includes a control unit that uses input information from other controllers or sensors or other elements to create a timing signal in order to control switching timing of the IGBT 111, and a driver that uses an output timing signal from the control unit to create a driving signal required for the IGBT 111 to perform switching operation.

The control unit is constituted by a microcomputer. A target torque value requested to the motor generator 30 (40), a value of the electric current supplied from the semiconductor module 101 to the armature winding assembly 31 (41) of the motor generator 30 (40), and a magnetic pole position of the rotor of the motor generator 30 (40) are input as input information to the microcomputer. The target torque value is based on a command signal that has been output from a host controller. The electric current value is a result of detection based on a detection signal output from a current sensor 194. The magnetic pole position is a result of detection based on a detection signal output from a rotor magnetic pole sensor 32

(42) provided in the motor generator 30 (40). An example of detecting two phases of current data is described below in connection with the present embodiment. However, three phases of current data may be detected instead.

The microcomputer uses the above target torque value to compute electric current command data on a d-axis and a q-axis, uses differentials between computed electric current command data of the d-axis and q-axis and detected electric current command data of the d-axis and q-axis to compute voltage command data on the d-axis and the q-axis, and uses a detected magnetic pole position to convert computed voltage command data of the d-axis and q-axis into voltage command data of each phase (U, V, W). Also, the microcomputer create a pulse-like modulated wave by comparing a fundamental wave (sine wave) and a carrier wave (triangular wave) based on the voltage command data of the U-phase, V-phase, and W-phase, and outputs the modulated wave as a PWM (Pulse Width Modulated) signal to the driver. Six PWM signals, one for the upper or lower arm of each phase, are output from the microcomputer to the driver. Timing signals output from the microcomputer may be other signals such as rectangular wave signals.

The driver is constituted by an integrated circuit, or an IC that is an integrated set of multiple electronic circuit components. While the present embodiment is described below taking a one-in-one scheme as an example of providing one IC for the upper or lower arm of each phase, the present invention may employ any other scheme such as a two-in-one scheme with one IC provided for the upper and lower arms of each phase, or a six-in-one scheme with one IC provided for all arms. To drive the lower arm, the driver amplifies an associated PWM signal and outputs the PWM signal as a driving signal to the gate electrode of the IGBT 111 of the lower arm. To drive the upper arm, the driver shifts a reference potential level of an associated PWM signal to a reference potential level of the upper arm before amplifying the PWM signal, and then outputs the PWM signal as a driving signal to the gate electrode of the IGBT 111 of the upper arm. Thus, each IGBT 111 performs the switching operation in accordance with the input driving signal.

The controller 103 also detects abnormal states (overcurrent, overvoltage, overtemperature, and the like), thus protecting the semiconductor module 101. For this purpose, sensing information is input to the controller 103. For example, information on the current flowing through the source electrode of each IGBT 111 is input from a sensor lead wire 163 of each arm to the associated driver (IC). Accordingly, the driver (IC) conducts overcurrent detection and if an overcurrent is detected, the driver (IC) stops the switching operation of the associated IGBT 111 and protects the associated IGBT 111 from the overcurrent. Temperature information on the semiconductor module 101 is input from a temperature sensor 104 provided in/on the semiconductor module 101, to the microcomputer. Voltage information on the DC positive-polarity side of the semiconductor module 101 is also input to the microcomputer. The microcomputer conducts overtemperature and overvoltage detection based on those kinds of information, and if an overtemperature or an overvoltage is detected, the microcomputer stops the switching operation of all IGBTs 111 and protects the semiconductor module 101 from the overtemperature or the overvoltage.

Next, actual configurations of the inverters 100, 300 for realizing the electric circuit configuration of FIG. 19 will be described hereunder using FIGS. 1 to 18.

Under the conventional techniques, multiple semiconductor chips are mounted on the heat-releasing base of a module casing via an electrically insulated circuit board, then wiring is conducted using wiring members such as wires, and a semiconductor module is constructed. In the present embodiment, however, semiconductor chips and wiring members are constructed as components or devices beforehand in a separated state with respect to the semiconductor module. Thus, a so-called discrete component construction or device construction is realized and the semiconductor module is constructed by building the discrete components or the devices into the semiconductor module during manufacture thereof.

First, a configuration of the electric circuit device (semiconductor device) 110, one of the above discrete components or devices, will be described hereunder using FIGS. 1 to 5.

In the present embodiment, as described above, the arms are constructed as discrete components or devices in two-in-one units.

The electric circuit device 110 is, in appearance, a structure formed as follows. First, three kinds of elements (namely, the semiconductor chips constituting an IGBT 111 and a diode 112, metallic buffering members 113, 114, and portions of multiple electrodes and multiple wires) are first embedded in a molded body 150 constructed by transfer-molding a sealing resin (epoxy resin) that is a packaging material. Next, other portions of the multiple electrodes and multiple wires are either extended outward from the inside of the molded body 150 to the outside thereof, or exposed outside the molded body 150.

The electric circuit device 110 has the intermediate electrode 120, the positive-polarity electrode 130, and the negative-polarity electrode 140, as the above multiple electrodes. The intermediate electrode 120, the positive-polarity electrode 130, and the negative-polarity electrode 140 are each formed using a flat-plate conductor made of a metal, for example, a copper alloy or copper excellent in thermal conductivity and in electrical conductivity. The electric circuit device 110 has the foregoing gate lead wires 160, 162 and sensor lead wires 161, 163, as the above multiple wires. The gate lead wires 160, 162 and the sensor lead wires 161, 163 are each formed using an elongated rod-like or pin-shaped prismatic conductor made of a metal, for example, a copper alloy or copper excellent in thermal conductivity and in electrical conductivity.

In the present embodiment, the intermediate electrode 120, the positive-polarity electrode 130, and the negative-polarity electrode 140 are constructed so that the semiconductor chips inside the electric circuit device 110 can be improved in heat release characteristics and reduced in line inductance at the same time.

In the present embodiment, the intermediate electrode 120 is hereinafter referred to simply as the M-electrode 120, the positive-polarity electrode 130 as the P-electrode 130, and the negative-polarity electrode 140 as the N-electrode 140, the gate lead wires 160, 162 as the G-wires 160, 162, and the sensor lead wires 161, 163 as the S-wires 161, 163.

Additionally, in the present embodiment, in a rectangular parallelepide or square plate body, one pair of rectangular opposed planes larger in surface area than other planes are defined as principal planes. Also, four rectangular planes of the rectangular parallelepide or square plate body that extend along, and are formed at right angles to, four edges (four sides) of each such principal plane, and that have surface areas smaller than those of the principal planes, are defined as peripheral planes. In addition, one pair of longer sides of all four sides that constitute rectangular planes including the principal planes are defined as long sides, and one pair of shorter sides are defined as short sides. Furthermore, a direction in which the long sides of each rectangular plane including each principal plane extends is defined as a long-side direction or a longitudinal direction, and a direction in which the short sides of the rectangular plane including the principal plane extends is defined as a short-side direction or a lateral direction. Moreover, a distance between the principal planes is defined as thickness or height, and an opposite direction to each principal plane (i.e., a direction in which the long sides of each peripheral plane extends) is defined as a thickness direction or a height direction.

The molded body 150 is subdivided into two molded bodies: a first molded section 151 and a second molded section 152.

The first molded section 151 is a rectangular parallelepipe or square plate section formed to package semiconductor chip-mounting sections of the M-electrode 120, P-electrode 130, and N-electrode 140, and to package portions of the G-wires 160, 162, and S-wires 161, 163. Length of the first molded section 151 is greater than plate thicknesses of the above electrodes or diameters of the above wires.

The second molded section 152 is formed centrally at one of lateral edges of the first molded section 151. The second molded section 152 is a polyhedral solid section for packaging respective bends of the P-electrode 130 and N-electrode 140, and is formed integrally with the first molded section 151. The polyhedral solid constituting the second molded section 152 is a cutout formed by cutting off a portion of the rectangular parallelepide. That is to say, when the rectangular parallelepide is disposed so that one principal plane thereof faces the first molded section 151, this principal plane facing the first molded section 151 is formed into a stepped shape and a concave-like groove 153 extending continuously in the long-side direction is formed centrally in the short-side direction of the other principal plane of the rectangular parallelepide. The portion of the second molded section 152 that extends in the same direction as that of the long sides of the first molded section 151 is dimensionally smaller than the long sides of the first molded section 151. The portion of the second molded section 152 that extends in the same direction as thickness of the long sides of the first molded section 151 is dimensionally larger than thickness of the first molded section 151. The second molded section 152 is formed with two steps. One of the two steps forms a connection region with respect to one lateral peripheral planes of the first molded section 151, and is higher than the other step. That is to say, one step is an upper stage and the other step is a lower stage.

The concave-like groove 153 formed at a second short side of the second molded section 152 is formed so as to engage with a convex-like protrusion provided on a connecting member of the capacitor device 102 described on later pages herein. The concave-like groove 153 may be a convex-like protrusion, in which case, the convex-like protrusion provided on the connecting member of the capacitor device 102 is formed as a concave-like groove instead.

In the present embodiment, one principal plane (left side on the paper) of the first molded section 151 is hereinafter defined as a first principal plane, and the other principal plane (right side on the paper) as a second principal plane. Also, one lateral side (front side on the paper) of the first molded section 151 is defined as a first lateral side, and the other lateral side (rear side on the paper) as a second lateral side. In addition, one longitudinal side (upper side on the paper) is defined as a first longitudinal side, and the other longitudinal side (lower side on the paper) as a second longitudinal side. Furthermore, one side (left side on the paper) in the thickness direction of the first molded section 151 is defined as a first principal plane side, and the other side (right side on the paper) as a second principal plane side.

Inside the first molded section 151, the M-electrode 120, the G-wire 162, and the S-wire 163 are arranged at the first principal plane side, and the P-electrode 130, the N-electrode 140, the G-wire 160, and the S-wire 161 are arranged at the second principal side. Respective electrode surfaces of the M-electrode 120, P-electrode 130, N-electrode 140 are arranged in parallel to one another. The four electrode surfaces are also maintained in a parallel arrangement relationship with respect to the first and second principal planes of the first molded section 151.

The M-electrode 120 is constituted by a heat-releasing section 121, a lead wire 122, and a lead terminal 123.

The heat-releasing section 121 constitutes a mounting circuit board and heat-releasing circuit board for semiconductor chips, and is a rectangular flat-plate section extending along, and in parallel to, the first principal plane of the first molded section 151. Long sides of the heat-releasing section 121 extend in the same direction as that of the long sides of the first molded section 151, and are shorter than the long sides of the first molded section 151. Short sides of the heat-releasing section 121 extend in the same direction as that of the short sides of the first molded section 151, and are shorter than the long sides of the first molded section 151. A first principal plane of the heat-releasing section 121 is formed as a heat release plane. The heat release plane of the heat-releasing section 121 becomes exposed at the surface of the first principal plane of the first molded section 151 so as to be flush with the first principal plane thereof. A second principal plane of the heat-releasing section 121 is formed as a mounting surface.

The lead wire 122 constituting an output end of an arm is formed at a first longitudinal edge of the heat-releasing section 121. The lead wire 122 is a rectangular flat-plate section bent at right angles to a first longitudinal side of the heat-releasing section 121 from a central portion of a first longitudinal peripheral plane thereof, then extending straightly, and further extended outward from the first longitudinal peripheral plane of the first molded section 151. The lead wire 122 is disposed on the same plane as that of the heat-releasing section 121, and is formed integrally therewith. Short sides of the lead wire 122 extend in the same direction as that of the long sides of the first molded section 151, and are shorter than the short sides of the heat-releasing section 121. Long sides of the lead wire 122 extend to a first longitudinal side thereof.

The lead terminal 123 constituting a connecting portion of the output end of the arm is formed at a first longitudinal edge of the lead wire 122. The first longitudinal edge of the lead wire 122 further extends straightly to the first longitudinal side thereof in that state, whereby the lead terminal 123 is formed as a rectangular flat-plate section. The lead terminal 123 is disposed on the same plane as that of the lead wire 122, and is formed integrally therewith. A principal plane (terminal surface) of the lead terminal 123 is formed with a circular screw hole 124 cut through in the thickness direction of the first molded section 151.

The P-electrode 130 and the N-electrode 140 are arranged at a section opposed to a second principal plane side of the M-electrode 120.

The N-electrode 140 is constituted by a heat-releasing section 141, a lead wire 142, a lead terminal 143, a first bend 144, and a second bend 145.

The heat-releasing section 141 constitutes a mounting circuit board and heat-releasing circuit board for semiconductor chips, and is a rectangular flat-plate section extending along, and in parallel to, the second principal plane of the first molded section 151. Short sides of the heat-releasing section 141 extend in the same direction as that of the long sides of the first molded section 151, and are shorter than the long sides of the first molded section 151. Long sides of the heat-releasing section 141 extend in the same direction as that of the short sides of the first molded section 151, and are equal to the short sides of the first molded section 151 in terms of length. A second principal plane of the heat-releasing section 141 is formed as a heat release plane. The heat release plane of the heat-releasing section 141 becomes exposed at the surface of the second principal plane of the first molded section 151 so as to be flush with the second principal plane thereof. A first principal plane of the heat-releasing section 141 is formed as a mounting surface.

The first bend 144 that changes a conductor position is formed at a second lateral edge of the heat-releasing section 141. The second lateral edge of the heat-releasing section 141 is bent intact at right angles to the M-electrode 120 and extends straightly thereto, whereby the first bend 144 is formed as a rectangular flat-plate section. The first bend 144 is formed integrally with the heat-releasing section 141. Long sides of the first bend 144 extend in the same direction as that of the long sides of the heat-releasing section 141, and are equal to the long sides thereof in terms of length. Short sides of the first bend 144 extend in a direction of the M-electrode 120, and are shorter than the short sides of the lead wire 122.

The lead wire 142 constituting a high-potential input end of the arm is formed at an edge of a first principal plane of the first bend 144. The edge of the first principal plane of the first bend 144 is bent intact at right angles to a second lateral edge thereof, then after extending straightly along, and in parallel to, the mounting plane of the heat-releasing section 121, further bent at right angles to a second longitudinal edge of the first bend 144, and extending straightly in parallel with respect to the mounting plane of the heat-releasing section 121. The lead wire 142 is thus formed as an L-shaped flat-plate section. The lead wire 142 is disposed on a plane different from that of the heat-releasing section 121, and is formed integrally with the first bend 144. In this fashion, a position of the lead wire 142 is changed by the first bend 144, and is closer to the M-electrode 120 than to the heat-releasing section 121.

Of two edges of the L-shaped flat-plate conductor constituting the lead wire 142, the edge opposite to that facing the first bend 144 (i.e., the edge extending towards the second longitudinal side) is formed with the second bend 145 that changes the conductor position. The side edge of the second bend 145 that extends towards the second longitudinal side of the lead wire 142 is bent intact at right angles to the M-electrode 120 and extends straightly thereto, whereby the second bend 145 is formed as a rectangular flat-plate section. The second bend 145 is formed integrally with the lead wire 142. Long sides of the second bend 145 extend in the same direction as that of a side of the side edge extending towards the second longitudinal side of the lead wire 142, and have a length equal to that of the side of the side edge extending towards the second longitudinal side of the lead wire 142. Short sides of the second bend 145 extend in the direction of the M-electrode 120, and are shorter than the short sides of the lead wire 122.

The lead terminal 143 constituting a connecting portion of another output end of the arm is formed at an edge of a first principal plane of the second bend 145. The first principal plane side edge of the second bend 145 is bent intact at right angles to the second longitudinal side, then extends straightly in parallel with respect to the mounting plane of the heat-releasing section 121, and further extends outward from the second longitudinal side edge of the second molded section 152. The lead terminal 143 is thus formed as a rectangular flat-plate section. The lead terminal 143 is disposed on a plane different from those of the heat-releasing section 141 and lead wire 142 (that is, the lead terminal 143 is disposed on the same plane as that of the heat-releasing section 121, directly under the second longitudinal side thereof). The lead terminal 143 is formed integrally with the second bend 145. In this fashion, a position of the lead terminal 143 is changed by the second bend 145, and is closer to the M-electrode 120 than to the heat-releasing section 141 and the lead wire 142. Short sides of the lead terminal 143 extend in the same direction as that of the long sides of the heat-releasing section 141, and are shorter than the long sides thereof. Long sides of the lead terminal 143 extend in the same direction as that of the long sides of the second bend 145, and equal to the long sides thereof in terms of length. A circular screw hole 146 extending through in the thickness direction of the first molded section 151 is formed at a second lateral side edge of a principal plane (terminal surface) of the lead terminal 143.

The P-electrode 130 is constituted by a heat-releasing section 131, a lead wire 132, a lead terminal 133, and a bend 134.

The heat-releasing section 131 constitutes a mounting circuit board and heat-releasing circuit board for semiconductor chips, and is a rectangular flat-plate section extending along, and in parallel to, the second principal plane of the first molded section 151. Short sides of the heat-releasing section 131 extend in the same direction as that of the long sides of the first molded section 151, and are shorter than the long sides of the first molded section 151. Long sides of the heat-releasing section 131 extend in the same direction as that of the short sides of the first molded section 151, and are equal to the short sides of the first molded section 151 in length. A second principal plane of the heat-releasing section 131 forms a heat release plane. The heat release plane of the heat-releasing section 131 becomes exposed at the surface of the second principal plane of the first molded section 151 so as to be flush with the second principal plane thereof. A first principal plane of the heat-releasing section 131 forms a mounting surface.

The lead wire 132 constituting a low-potential input end of the arm is formed at a second lateral side edge of the heat-releasing section 131. A first lateral side edge of the heat-releasing section 131 extends intact along the second principal plane of the lead wire 142, in parallel to the second principal plane thereof, and further straightly towards the first lateral side. Additionally, the first lateral side edge of the heat-releasing section 131 is bent at right angles to the second longitudinal side and extends straightly along, and in parallel to, the second principal plane of the lead wire 142. The lead wire 132 is thus formed as an L-shaped flat-plate section. The lead wire 132 is disposed on the same plane as that of the heat-releasing section 131, and is formed integrally therewith. The second principal plane of the lead wire 142 constitutes a heat release plane of the semiconductor chip.

In the present embodiment, the second principal plane of the lead wire 132 is constructed as a heat release plane, and is exposed from the second principal plane of the first molded section 151. However, this heat release plane may be covered with mold resin.

Of two edges of the L-shaped flat-plate conductor constituting the lead wire 132, the edge opposite to that facing the heat-releasing section 131 (i.e., the edge extending towards the second longitudinal side) is formed with the bend 134 that changes the conductor position. The edge of the bend 134 that extends towards the second longitudinal side of the lead wire 132 is bent at right angles to the opposite side with respect to the M-electrode 120, whereby the bend 134 is formed as a rectangular flat-plate section. The bend 134 is formed integrally with the lead wire 132. Long sides of the bend 134 extend in the same direction as that of a side of the edge extending towards the second longitudinal side of the lead wire 132, and have a length equal to that of the side of the edge extending towards the second longitudinal side of the lead wire 132. Short sides of the bend 134 extend in the direction of the M-electrode 120, and are shorter than the short sides of the lead wire 122.

The lead terminal 133 constituting a connecting portion of a low-potential input end of the arm is formed at a side edge of a second principal plane of the bend 134. The second principal plane side edge of the bend 134 is bent intact at right angles to the second longitudinal side, then extends straightly along, and in parallel to, the second principal plane of the heat-releasing section 143, and further extends outward from the second longitudinal side edge of the second molded section 152. The lead terminal 133 is thus formed as a rectangular flat-plate section. The lead terminal 133 is disposed on a plane different from those of the heat-releasing section 131 and lead wire 132 (that is, the lead terminal 143 is disposed externally to the second principal plane of the first molded section 151). The lead terminal 133 is formed integrally with the bend 134. In this fashion, a position of the lead terminal 133 is changed by the bend 134, and is more distant from the M-electrode 120 than from the heat-releasing section 131 and the lead wire 132. Short sides of the lead terminal 133 extend in the same direction as that of the long sides of the heat-releasing section 131, and are shorter than the long sides of the heat-releasing section 141. Long sides of the lead terminal 133 extend in the same direction as that of the long sides of the bend 134, and equal to the long sides thereof in terms of length. A circular screw hole 135 extending through in the thickness direction of the first molded section 151 is formed at a first lateral side edge of a principal plane (terminal surface) of the lead terminal 133.

Between the mounting surfaces of the heat-releasing sections 121 and 131, semiconductor chips that constitute the upper-arm IGBT 111 and the upper-arm diode 112 are arranged next to each other in a longitudinal direction, and the semiconductor chips are mounted at the second lateral side edge.

In the present embodiment, the semiconductor chip constituting the upper-arm IGBT 111 is hereinafter referred to as the HI chip, and the semiconductor chip constituting the upper-arm diode 112, as the HD chip.

For the HI chip disposed at the first longitudinal side, the chip surface that faces the second principal plane is solder-bonded to the mounting surface of the heat-releasing section 131 such that the collector electrode formed on the chip surface facing the second principal plane is electrically connected to the mounting surface of the heat-releasing section 131. For the HD chip disposed at the second longitudinal side, the chip surface that faces the second principal plane is solder-bonded to the mounting surface of the heat-releasing section 131 such that the cathodic electrode formed on the chip surface facing the second principal plane is electrically connected to the mounting surface of the heat-releasing section 131. A second principal plane of the buffering member 113 is solder-bonded to the chip surface of the HI chip at the first principal plane such that the emitter electrode and the buffering member 113 are electrically connected. A second principal plane of the buffering member 114 is solder-bonded to the chip surface of the HD chip at the first principal plane such that the anodic electrode and the buffering member 114 are electrically connected. First principal planes of the buffering members 113, 114 are solder-bonded to the mounting surface of the heat-releasing section 121. In this way, the HI chip and the HD chip are mounted in a stacked form between the mounting surfaces of the heat-releasing sections 121 and 131.

Between the mounting surfaces of the heat-releasing sections 121 and 141, semiconductor chips that constitute the lower-arm IGBT 111 and the lower-arm diode 112 are arranged next to each other in a longitudinal direction, and the semiconductor chips are mounted at the first lateral side edge.

In the present embodiment, the semiconductor chip constituting the lower-arm IGBT 111 is hereinafter referred to as the LI chip, and the semiconductor chip constituting the upper-arm diode 112, as the LD chip.

For the LI chip disposed at the first longitudinal side, the chip surface that faces the first principal plane is solder-bonded to the mounting surface of the heat-releasing section 121 such that the collector electrode formed on the chip surface facing the first principal plane is electrically connected to the mounting surface of the heat-releasing section 121. For the LD chip disposed at the second longitudinal side, the chip surface that faces the first principal plane is solder-bonded to the mounting surface of the heat-releasing section 121 such that the cathodic electrode formed on the chip surface facing the first principal plane is electrically connected to the mounting surface of the heat-releasing section 121. The first principal plane of the buffering member 113 is solder-bonded to the chip surface of the LI chip at the second principal plane such that the emitter electrode and the buffering member 113 are electrically connected. The first principal plane of the buffering member 114 is solder-bonded to the chip surface of the LD chip at the second principal plane such that the anodic electrode and the buffering member 114 are electrically connected. The second principal planes of the buffering members 113, 114 are solder-bonded to the mounting surface of the heat-releasing section 141. In this way, the LI chip and the LD chip are mounted in a stacked form between the mounting surfaces of the heat-releasing sections 121 and 141.

The buffering members 113, 114 are spacers that are used for alleviating thermal stresses, for establishing electrical and thermal connection between the HI chip, the HD chip, and the heat-releasing section 121, and for establishing electrical and thermal connection between the LI chip, the LD chip, and the heat-releasing section 141. The spacers are block structures of a rectangular solid shape, both made of a thermally conductive and electrically conductive metal, for example, an alloy of molybdenum and copper.

An example of bonding the buffering member 113 to the HI and LI chip surfaces facing the emitter electrode, and bonding the buffering member 114 to the HD and LD chip surfaces facing the cathodic electrode, has been described in the present embodiment. However, the buffering members 113 and 114 may be bonded to the chip surfaces facing in opposite directions.

In addition, if the buffering member 113 bonded to the HI chip surface at the emitter electrode side is bonded to the HI chip surface at the collector electrode side instead and the buffering member 114 bonded to the HD chip surface at the anodic electrode side is bonded to the HD chip surface at the cathodic electrode side, cooling capabilities of the HI chip and HD chip at the heat-releasing section 121 of the M-electrode 120 and cooling capabilities of the LI chip and LD chip can be made to equal each other.

A gate electrode and a current detection electrode are formed on the chip surface of the HI chip at the first principal plane and on the chip surface of the LI chip at the second principal plane. A G-wire 160 and an S-wire 161 are electrically connected to the gate electrode and current detection electrode, respectively, of the HI chip by bonding an aluminum wire between both. A G-wire 162 and an S-wire 163 are electrically connected to the gate electrode and current detection electrode, respectively, of the LI chip by bonding an aluminum wire between both.

The G-wire 160 and the S-wire 161, both juxtaposed in a long-side direction and arranged at the first longitudinal side of the second lateral side edge of the P-electrode 130, extend towards the first longitudinal side and then further extend outward from the first longitudinal peripheral plane of the first molded section 151. The G-wire 162 and the S-wire 163 juxtaposed in a long-side direction and arranged at the first longitudinal side of the first lateral side edge of the M-electrode 120, extend towards the first longitudinal side and then further extend outward from the first longitudinal peripheral plane of the first molded section 151.

When the electric circuit device 110 is assembled, the first principal plane-side chip surfaces of the LI chip and the LD chip are bonded to the mounting surface of the heat-releasing section 121 of the M-electrode 120 first. Next, the G-wire 162 is bonded to the gate electrode of the LI chip, and the S-wire 163, to the current detection electrode of the LI chip. Also, the buffering member 113 is bonded to the chip surface of the LI chip that faces the second principal plane, and the buffering member 114, to the chip surface of the LD chip that faces the second principal plane. A first assembly (see FIG. 1) at the M-electrode 120 is now completed.

Next, the first assembly and the N-electrode 140 are opposed to each other and the mounting surface of the heat-releasing section 141 of the N-electrode 140 is bonded to the planes of the buffering members 113, 114 that face the second principal plane. The N-electrode 140 is thus mounted in the first assembly so that the first principal plane of the lead wire 142 of the N-electrode 140 is as close as possible to the mounting surface of the heat-releasing section 121 of the M-electrode 120 via a clearance 117. The clearance 117 has a magnitude which, when the clearance 117 is filled with an insulating member (mold resin), an electrical insulating distance can be obtained between the M-electrode 120 and the N-electrode 140. The clearance 117 is determined by the length of the first bend 144 in the short-side direction thereof. A second assembly including the first assembly and the N-electrode 120 is now completed.

Next, the second principal plane-side chip surfaces of the HI chip and the HD chip are bonded to the mounting surface of the heat-releasing section 131 of the P-electrode 130. Next, the G-wire 160 is bonded to the gate electrode of the HI chip, and the S-wire 161, to the current detection electrode of the HI chip. Also, the buffering member 113 is bonded to the chip surface of the HI chip that faces the first principal plane, and the buffering member 114, to the chip surface of the HD chip that faces the first principal plane. A third assembly (see FIG. 1) at the P-electrode 130 is now completed. In the present embodiment, the third assembly is manufactured after the second assembly has been manufactured. However, the third assembly may be manufactured simultaneously with the first assembly, or after the first assembly has been manufactured, or before the second assembly is manufactured.

Next, the second assembly and the third assembly are opposed to each other and the mounting surface of the heat-releasing section 121 of the M-electrode 120 is bonded to the planes of the buffering members 113, 114 that face the first principal plane. The third assembly is thus mounted in the second assembly so that the second principal plane of the lead wire 142 of the N-electrode 140 is closely opposed to the first principal plane of the heat-releasing section 132 of the P-electrode 130 via a clearance 118. Also, the third assembly is mounted in the second assembly so that the first lateral side edge of the lead wire 132 is close to the second lateral side edge of the heat-releasing section 141 via a clearance 116. Additionally, the third assembly is thus mounted in the second assembly so that the first principal plane of the lead terminal 133 is opposed to the second principal plane of the lead terminal 143 via a clearance 115. The clearance 116 has a magnitude which, when the clearance 116 is filled with an insulating member (mold resin), an electrical insulating distance can be obtained between the P-electrode 130 and the N-electrode 140. The clearance 116 is determined by the lengths of the heat-releasing section 131, lead wire 132, and heat-releasing section 141, in the long-side directions of each. The clearance 118 has a magnitude which, when the clearance 118 is filled with an insulating member (mold resin), an electrical insulating distance can be obtained between the P-electrode 130 and the N-electrode 140. The clearance 118 is determined by the length of the first bend 144 in the short-side direction thereof. The clearance 115 has a magnitude that makes it possible for a connection member of the later-described capacitor device 102 to be inserted (engaged) without a clearance. The clearance 115 is determined by the lengths of the bend 134 and second bend 145 in the thickness direction of the first molded section 151. A fourth assembly including the second assembly and the third assembly is now completed (see FIG. 2).

Figure 3:
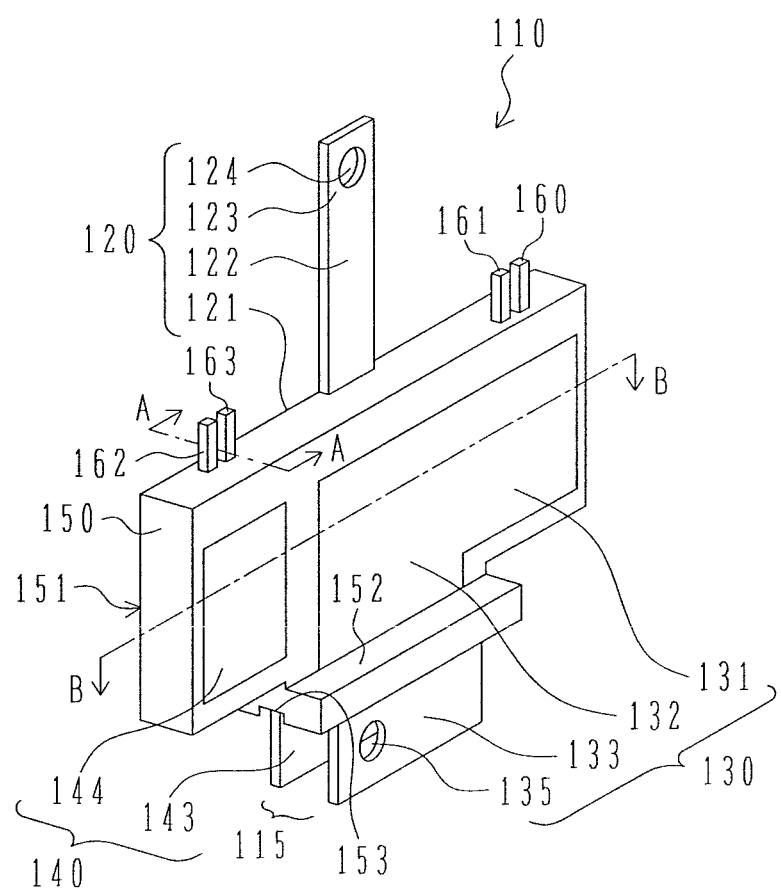
FIG. 3 is a perspective view showing an external configuration of the electric circuit device according to the first embodiment of the present invention.
Figure 4:
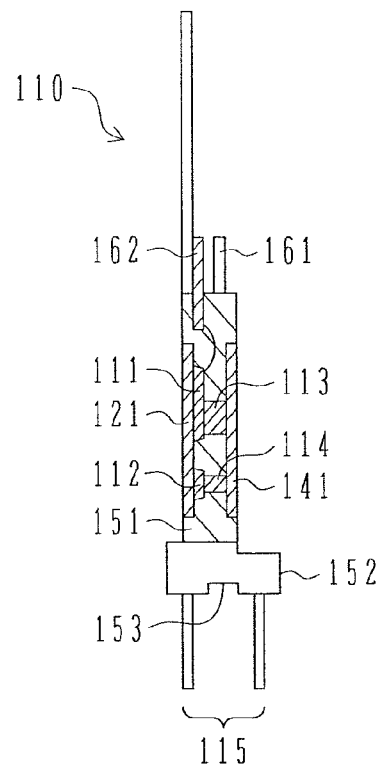
FIG. 4 is a cross-sectional view taken along the line A-A' of FIG. 3.
Figure 5:
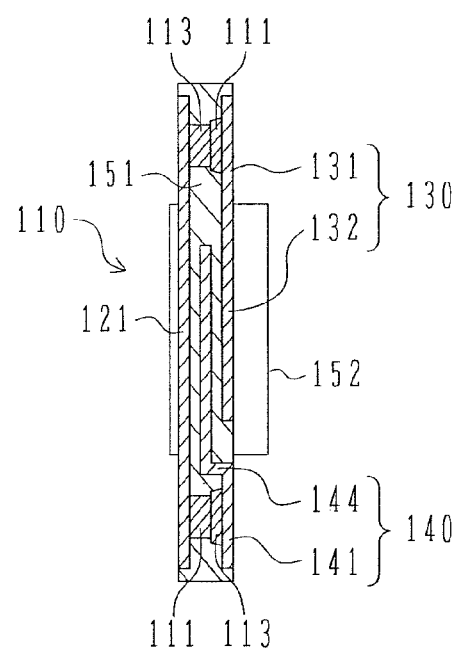
FIG. 5 is a cross-sectional view taken along the line A-B' of FIG. 3.

Next, the fourth assembly is fixed using a jig or a metallic mold. Next, heat and pressure are applied to a molded resin structure and then mold resin is poured into the jig or the metallic mold. Thus, a clearance between the fourth assembly and the jig or the metallic mold, and a clearance inside the fourth assembly are filled with the mold resin, whereby the molded body 150 shown in FIG. 3 is completed. In this case, the heat release plane of the heat-releasing section 121 of the M-electrode 120 becomes exposed at the surface of the first principal plane of the first molded section 150. Also, the heat release plane of the heat-releasing section 131 of the P-electrode 130, the heat release plane of the lead wire 132, and the heat release plane of the heat-releasing section 141 of the N-electrode 140 become exposed, in juxtaposed form in the long-side direction, at the surface of the second principal plane of the first molded section 151, since the heat-releasing section 131 of the P-electrode 130, the lead wire 132, and the heat-releasing sections 141 of the N-electrode 140 are arranged on the same plane. Additionally, the lead wire 122 of the M-electrode 120, the lead terminal 123, the G-wires 160, 162, and the S-wires 161, 163 are routed outward from the first longitudinal principal plane of the first molded section 151. Furthermore, the lead wire 133 of the P-electrode 130 and the lead terminal 143 of the N-electrode 140 are routed outward from the second longitudinal plane of the second molded section 152.

The mold resin has an electrical insulating property, and when used to fill the fourth assembly, the mold resin provides electrical insulation between the M-electrode 120, the P-electrode 130, the N-electrode 140, the G-wires 160, 162, and the S-wires 161, 163.

The screw hole 135 provided in the lead terminal 133, and the screw hole 146 provided in the lead terminal 143 are formed at opposite positions in the long-side direction. Thus, when the lead terminals 133 and 143 are opposed to each other, the screw holes 135 and 146 skew with respect to each other in the long-side direction.

According to the present embodiment described above, the N-electrode 140 is bent at the first bend 144 in the direction opposite to the P-electrode 130, the lead wire 132 of the P-electrode 130 and the lead wire 142 of the N-electrode 140 are opposed in parallel to each other in proximity to the bending direction of the N-electrode 140, and the lead terminals 133 and 143 are opposed in parallel to each other. Therefore, when a positive current flows into the lead wire 132 and the lead terminal 133 and a negative current equal to the positive current in magnitude and opposite in direction flows into the lead wire 142 and the lead terminal 143, a magnetic field generated by the positive current can be offset by a magnetic field generated by the negative current. Thus, according to the present embodiment, the magnetic field offset effect makes it possible to reduce the line inductance developed between the lead wire 132, 142 and the lead terminal 133, 143.

Figure 6:
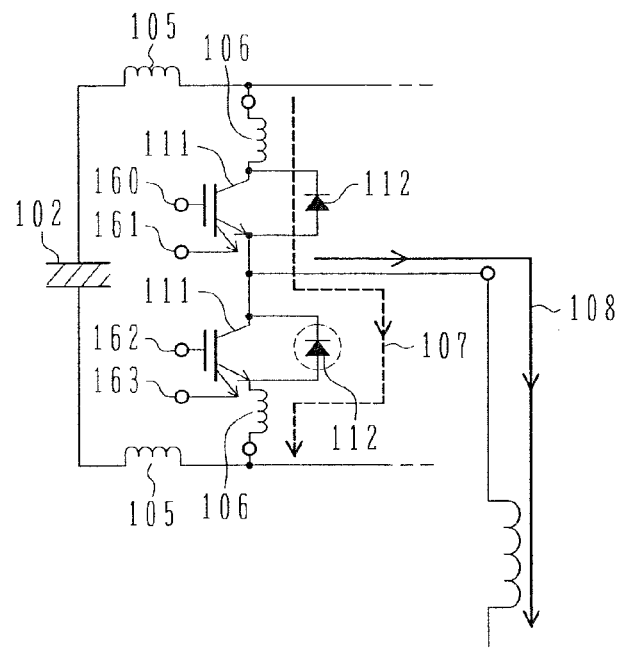
FIG. 6 is a circuit diagram that shows advantageous effects of the electric circuit device according to the first embodiment of the present invention.
Figure 7:
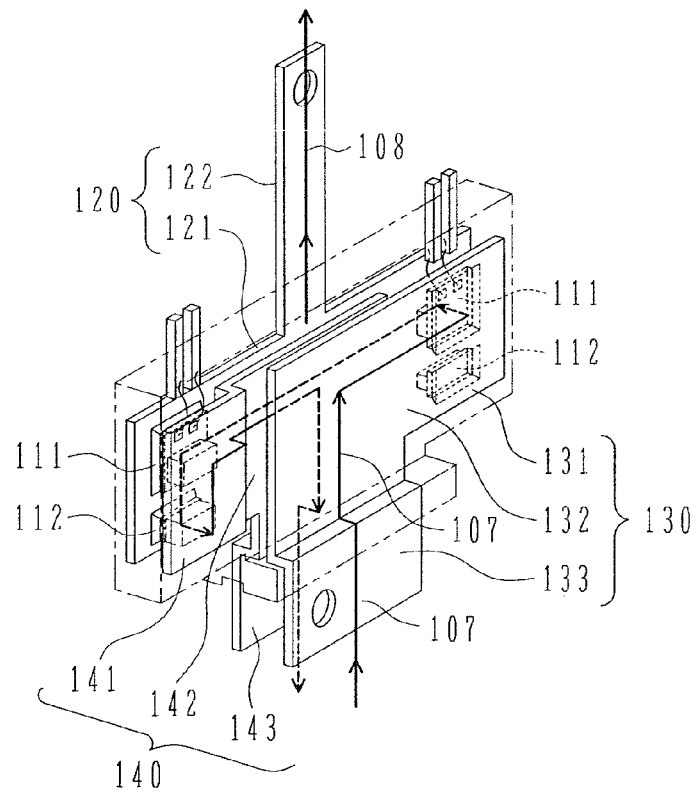
FIG. 7 is a perspective view that shows advantageous effects of the electric circuit device according to the first embodiment of the present invention.
Figure 8:
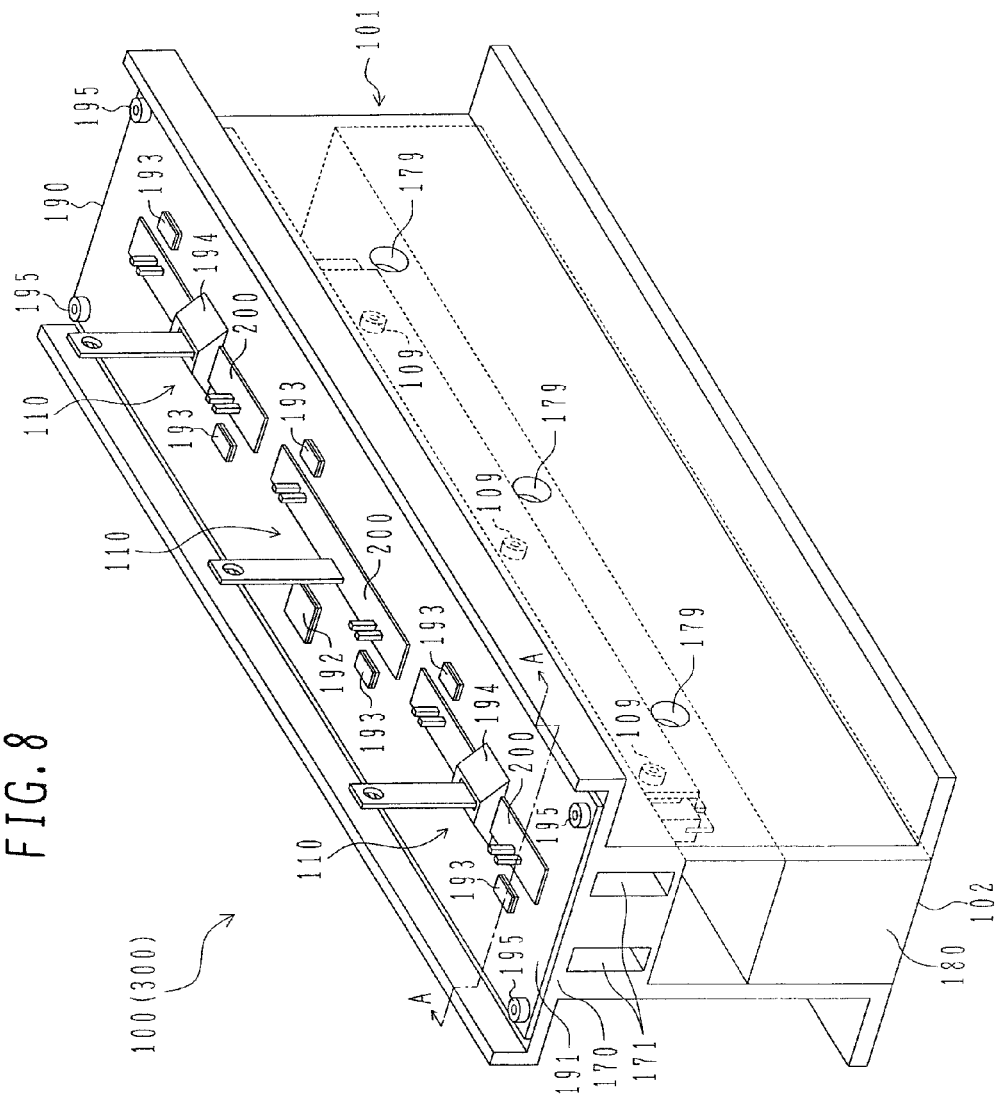
FIG. 8 is a perspective view showing an inverter configuration according to the first embodiment of the present invention.
Figure 9:
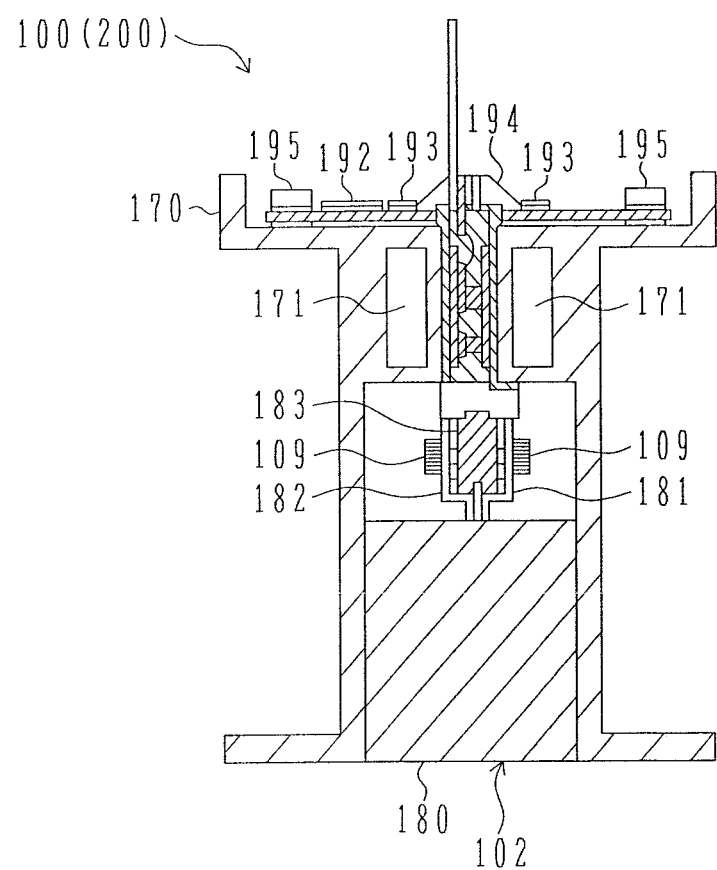
FIG. 9 is a cross-sectional view taken along the line A-A' of FIG. 8.
Figure 10:
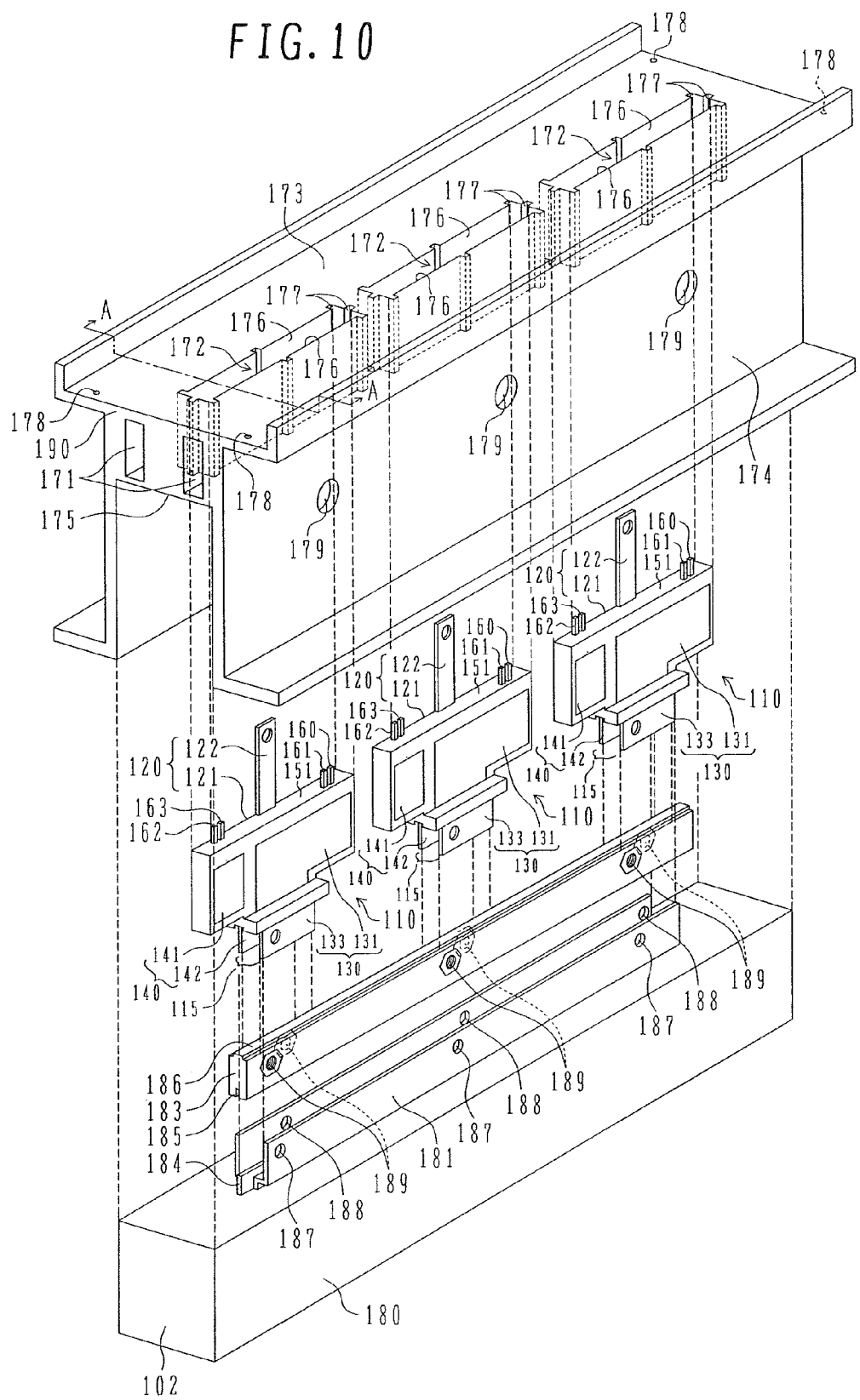
FIG. 10 is an exploded perspective view of FIG. 8.
Figure 11:
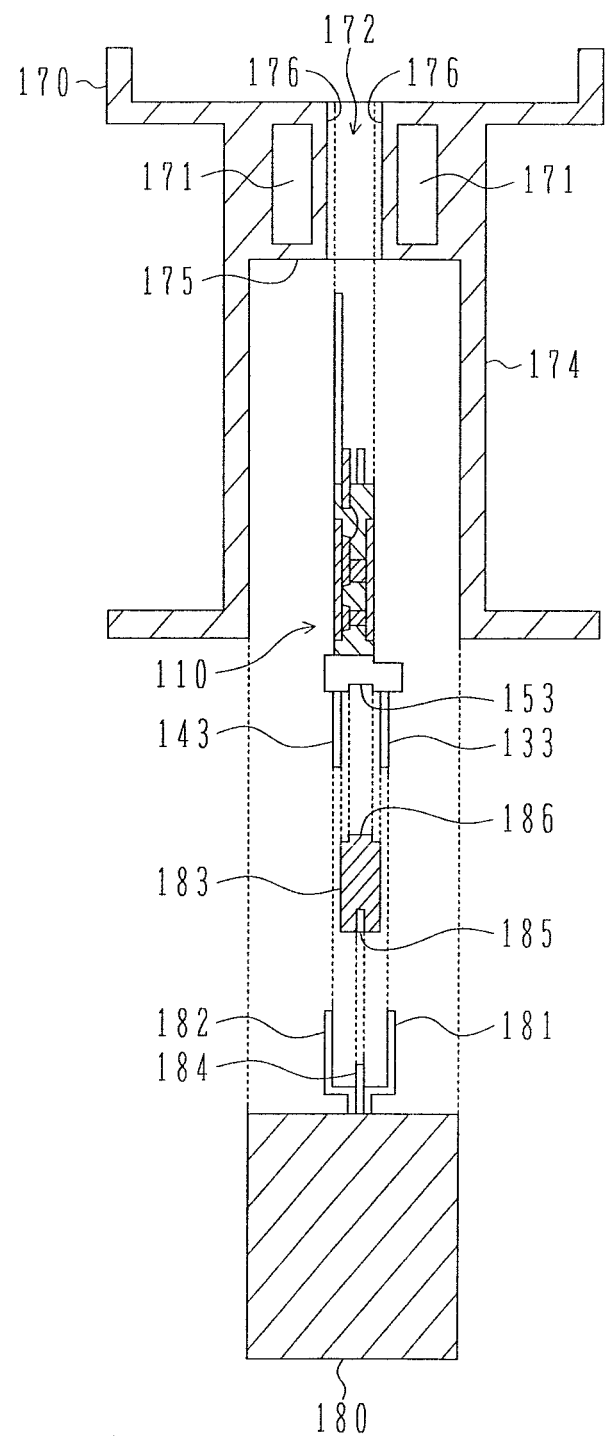
FIG. 11 is a cross-sectional view taken along the line A-A' of FIG. 10.
Figure 12:
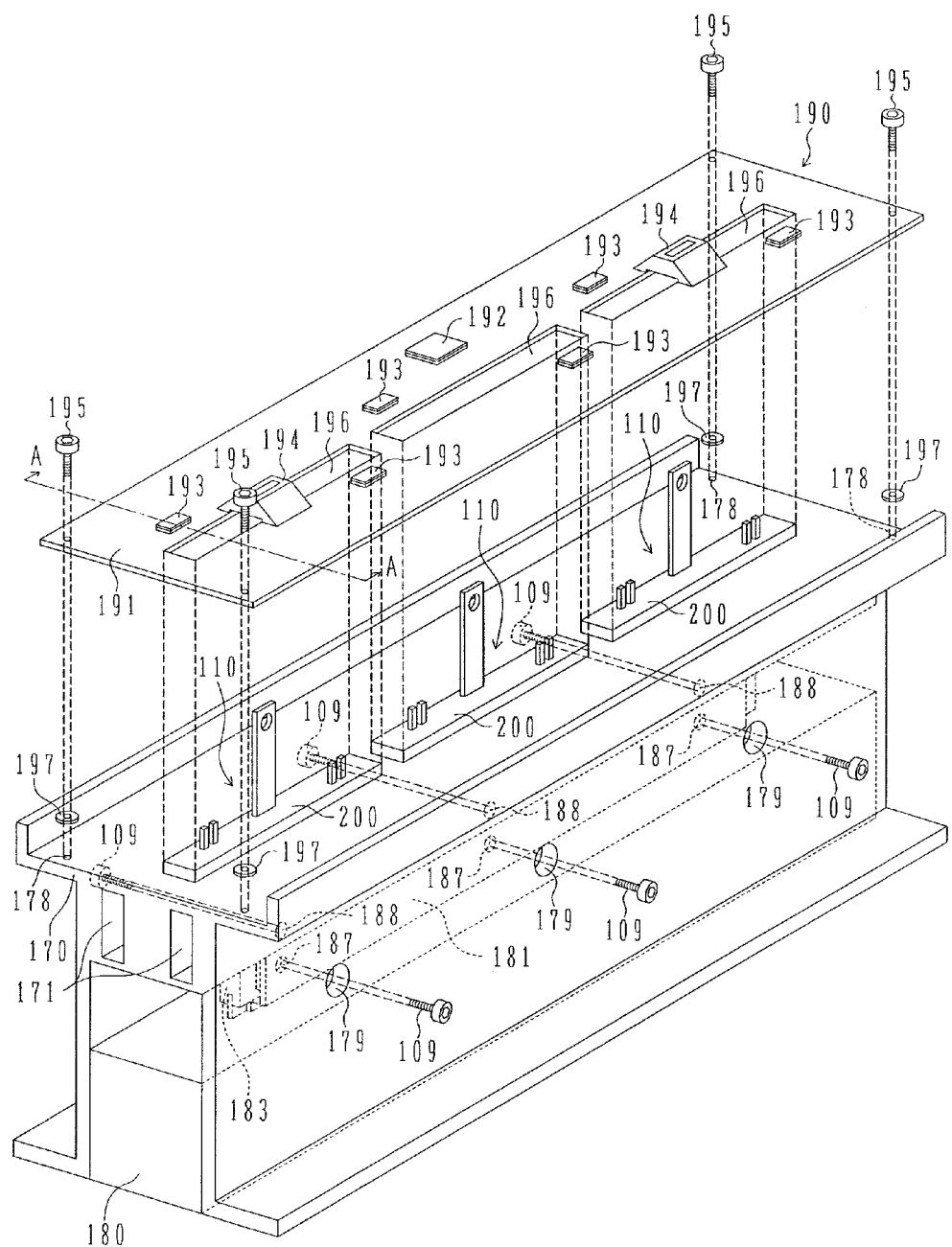
FIG. 12 is another exploded perspective view of FIG. 8.
Figure 13:
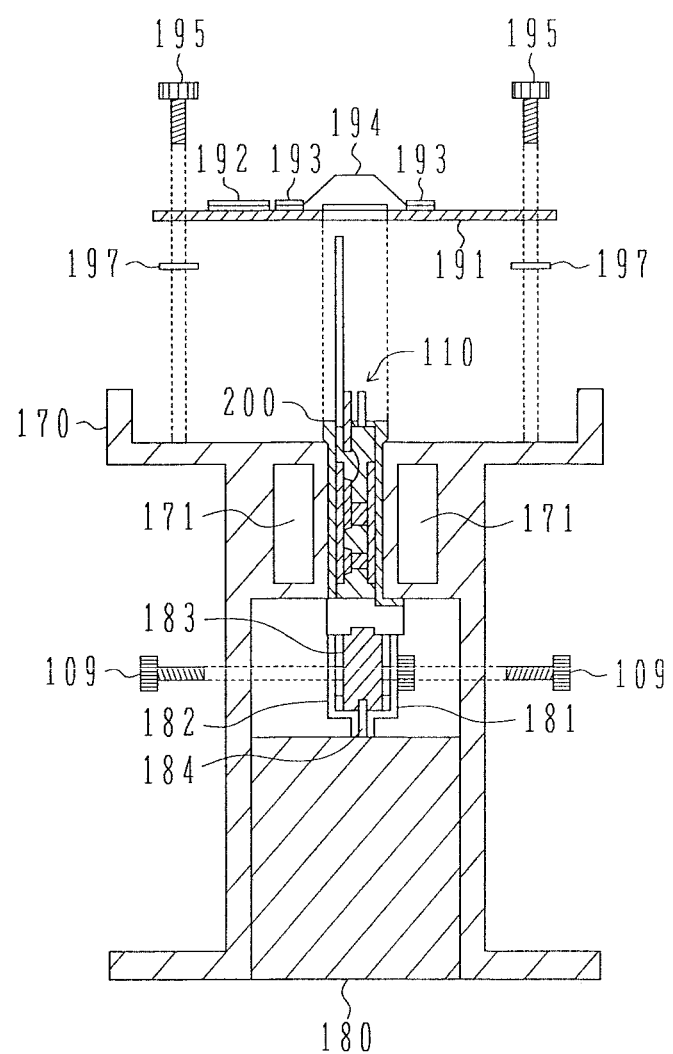
FIG. 13 is a cross-sectional view taken along the line A-A' of FIG. 12.
Figure 14:
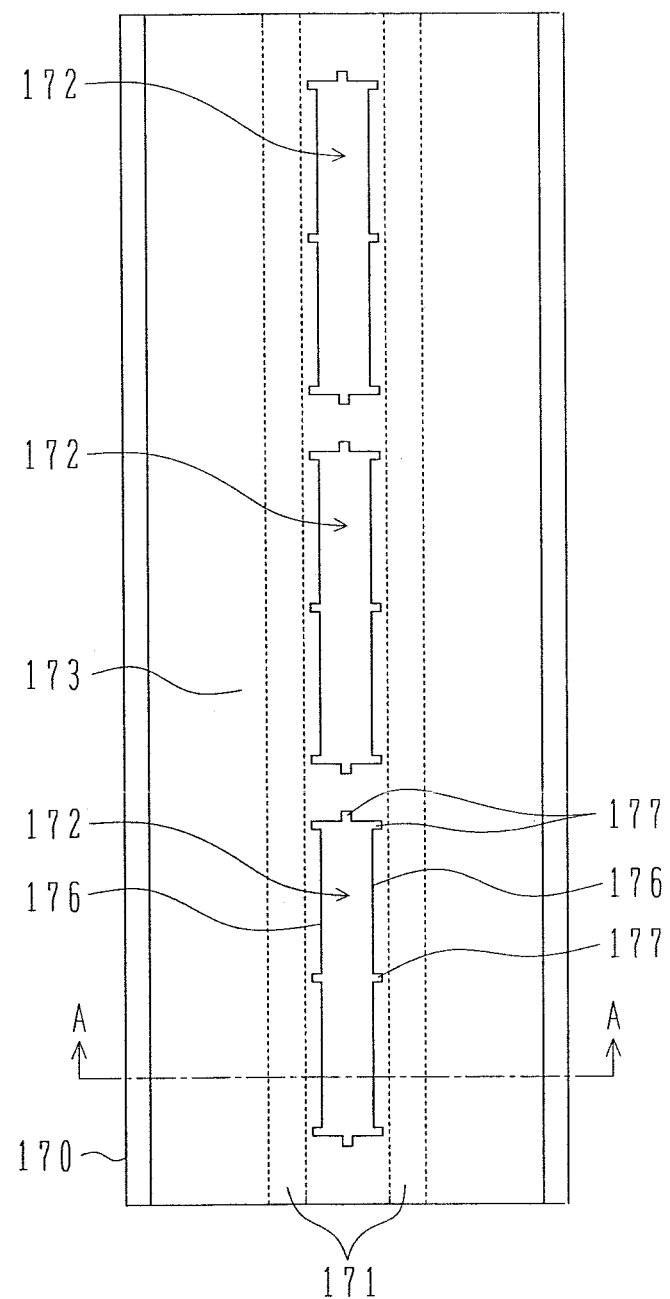
FIG. 14 is a plan view showing a configuration of a heat release base used in the inverter of FIG. 8.
Figure 15:
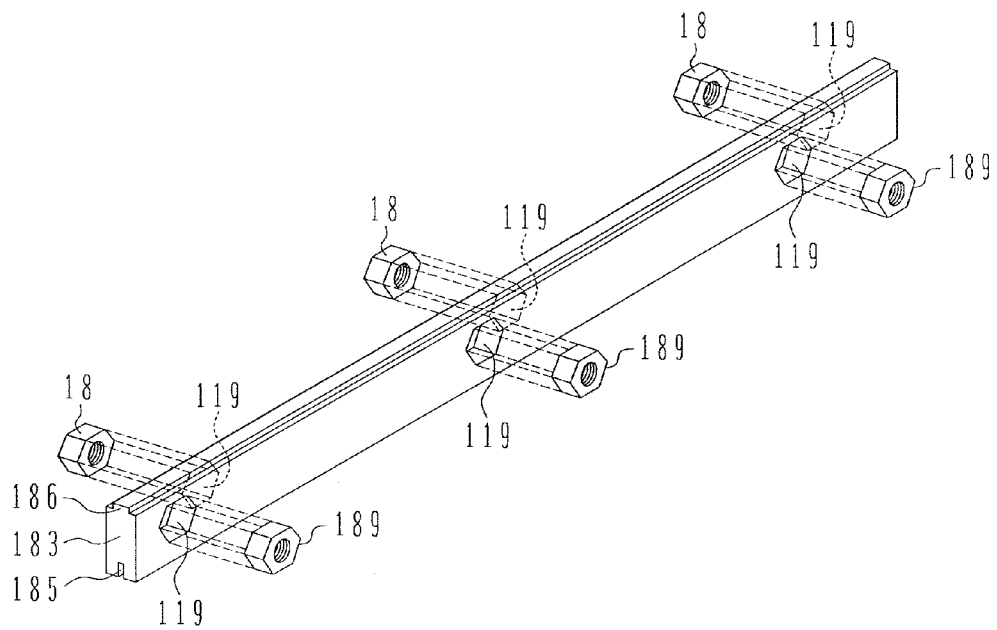
FIG. 15 is a perspective view showing a configuration of a connection member used in the inverter of FIG. 8.
Figure 16:
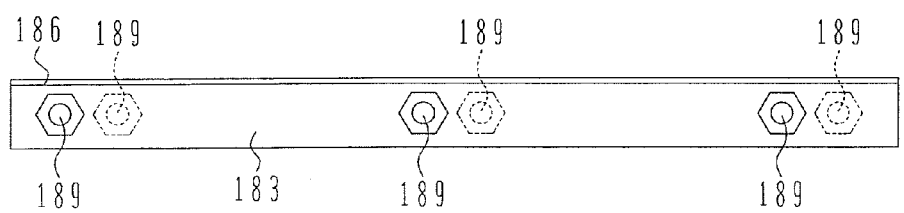
FIG. 16 is a side view showing the configuration of the connection member used in the inverter of FIG. 8.
Figure 17:
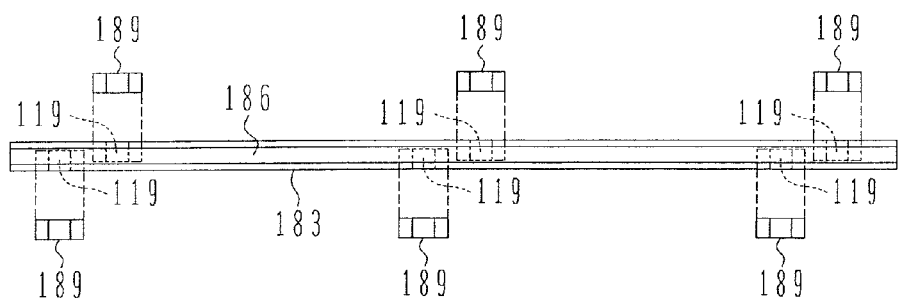
FIG. 17 is a top view showing the configuration of the connection member used in the inverter of FIG. 8.
Figure 18:
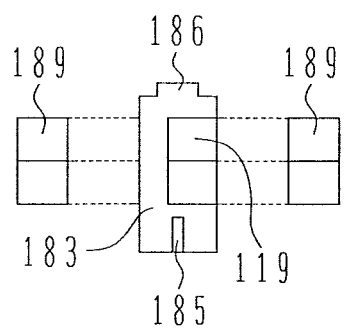
FIG. 18 is a cross-sectional view showing the configuration of the connection member used in the inverter of FIG. 8.

FIGS. 6 and 7 show more specifically a line inductance reduction effect obtainable in the above configuration. An example in which the IGBT 111 at the upper-arm side is switched from off to on is described below in the present embodiment.

As shown in FIG. 6, line inductance 106 exists between the collector electrode line (lead wire 132 and lead terminal 133) of the upper-arm IGBT 111 and the emitter electrode wiring (lead wire 142 and lead terminal 143) of the lower-arm IGBT 111. Also, line inductance 105 exists between the positive and negative lines of the capacitor device 102, as shown in FIG. 6. The electric circuit device 110 of the present embodiment is constructed so as to reduce the line inductance 106. As described later herein, the line inductance 115 is also reduced in the present embodiment.

When the upper-arm IGBT 111 is switched from off to on, a recovery current 107 routed from the DC positive-polarity side through the upper-arm IGBT 111 and the lower-arm diode 112 to the DC negative-polarity side flows into the arm for a moment. The arrow of a solid line, denoted as reference number 108, indicates a load current that flows when the upper-arm IGBT 111 is in a turn-on state.

As shown in FIG. 7, the recovery current 107 in the electric circuit device 110 flows from the led terminal 133 of the P-electrode 130 into the lead terminal 143 of the N-electrode 140. At this time, recovery currents that flow into the lead wire 132 and the lead wire 142 of the N-electrode 140 are equal in magnitude and opposite in direction. Recovery currents that flow into the lead wire 133 of the P-electrode 130 and the lead wire 143 of the N-electrode 140 are also equal in magnitude and opposite in direction. At the opposed sections described above, therefore, a magnetic field generated by the recovery current flowing into one side is offset by a magnetic field generated by the recovery current flowing into the other side, and the line inductance 106 is resultingly reduced.

Essentially the same effect as the above, is also expected to be obtainable when the upper-arm IGBT 111 is switched from on to off, when the lower-arm IGBT 111 is switched from off to on, and when the lower-arm IGBT 111 is switched from on to off.

According to the present embodiment, therefore, since the line inductance 106 in the electric circuit device 110 can be reduced, loss during the switching of the IGBT 111 can be reduced and the amount of heat generated thereby can also be reduced. Hence, according to the present embodiment, the electric circuit device 110 can be constructed using a more compact semiconductor chip that constitutes the IGBT 111, and thus the electric circuit device 110 can be miniaturized.

Additionally, according to the present embodiment, the semiconductor chips constituting the upper-arm IGBT 111 and diode 112 are sandwiched using the P-electrode 130 and the M-electrode 120, and the semiconductor chips constituting the lower-arm IGBT 111 and diode 112 are sandwiched using the N-electrode 140 and the M-electrode 120. Furthermore, the plane opposite to the mounting surface of the semiconductor chips of the P-electrode 130 and M-electrode 120, and the plane opposite to the mounting surface of the semiconductor chips of the N-electrode 140 and M-electrode 120 are exposed as heat release planes, at the surface of the first molded section 151. The heat generated by the semiconductor chips can be released from both chip surfaces thereof to outside via each electrode. This makes it possible, according to the present embodiment, to release a greater amount of heat from the semiconductor chips and improve cooling capabilities of the electric circuit device 110. Hence, according to the present embodiment, the electric circuit device 110 can be constructed using smaller semiconductor chips that constitute the IGBTs 111 and the diodes 112, and thus the electric circuit device 110 can be miniaturized.

As described above, the present embodiment makes it possible to achieve line inductance reduction in the electric circuit device 110 and the improvement of its cooling capabilities at the same time.

Next, a configuration of an actual inverter 100 (300) with the above-described electric circuit device 110 mounted therein will be described using FIGS. 8 to 18.

The inverter 100 (300) includes a semiconductor module 101, a capacitor device 102, and a circuit board unit 190 constituting a controller 103.

The semiconductor module 101 includes a heat release base 170 and an electric circuit device 110 mounted on the heat release base 170.

The heat release base 170, a heat-releasing element made of a metal excellent in thermal conductivity, such as aluminum, is a structure that includes a base unit for mounting and cooling the electric circuit device 110, a collar constituting an installation section with respect to an enclosure, and a cooling fin 174 for cooling the capacitor device 102. The base unit, the collar, and the cooling fin 174 are integrally formed by die-processing or cutting the above metallic material. The base unit is constructed of a block structure having a rectangular solid shape.

Hereinafter, in the present embodiment, when the base unit of the heat release base 170 is dimensionally maintained in a relationship of the depth is larger than the width and the height is smaller than the width, a depth direction of the base unit is defined as a longitudinal direction, a horizontal (width) direction as a lateral direction, and a height direction as a vertical direction or a thickness direction.

Centrally in the lateral direction of the base unit of the heat release base 170, three electric circuit device insertion sections 172 extending upright in the vertical direction from a lower face 175, towards an upper face 173, are arranged in line in the longitudinal direction. Each electric circuit device insertion section 172 is of a rectangular cross-sectional shape. In this state, the electric circuit device insertion section 172 is provided so that a direction in which its long sides extend is the same as the longitudinal direction. Side walls 176 formed at both sides of the electric circuit device insertion section 172, in the lateral direction thereof, each constitute a cooling surface. Each side wall 176 has a resin gate 177 at both ends in a longitudinal direction thereof, and centrally in the longitudinal direction. Each resin gate 177 is a cross-sectionally concave groove extending in the vertical direction. The resin gate 177, a cross-sectionally concave groove extending in the vertical direction, is also formed centrally in a lateral direction of each side wall formed at both sides of the electric circuit device insertion section 172 in the lateral direction thereof. The resin gate 177 is used to pour resin into a clearance between the electric circuit device insertion section 172 and the electric circuit device 110 when the electric circuit device 110 is inserted into the electric circuit device insertion section 172. The resin gate 177 is constructed so that the cross-sectionally concave groove avoids interference with the heat release planes of the electric circuit device 110.

The base unit of the heat release base 170 internally has a cooling medium flow channel 171 at both ends in the lateral direction. The cooling medium flow channels 171 each extending through from one longitudinal side face to another are arranged at lateral positions in parallel so that each side wall 176 is sandwiched from both lateral sides, and so as to be parallel to the side wall 176. Each cooling medium flow channel 171 is rectangular in cross-sectional shape. A coolant (water) flows as the cooling medium into the cooling medium flow channel 171.

A longitudinal dimension of the electric circuit device insertion section 172 (i.e., a distance between the side walls 176) is slightly larger than a dimension of the electric circuit device 110 in a thickness direction thereof (i.e., a distance between the first and second principal planes of the molded section 150) when the electric circuit device 110 is inserted into the electric circuit device insertion section 172. When the electric circuit device 110 is inserted into the electric circuit device insertion section 172, therefore, a clearance is formed between the first principal plane of the first molded section 151 and one side wall 176 and between the second principal plane of the first molded section 151 and the other side wall 176. These clearances are each filled in with resin 200 of high thermal conductivity.

The collars of the heat release base 170 are sections provided so as to protrude upward from both upper side faces of the base unit of the heat release base 170 in the lateral direction of the base unit, and the collars are constructed of a plate member having an L-shaped cross-sectional form. When the collars of the heat release base 170 are fixed to collars or installation portions of a metallic casing (not shown), the semiconductor module 101 is stored into the casing and fixed with the capacitor device 102 and the circuit board unit 190 remaining mounted in the module 101 (see FIG. 8). The inside of the casing is hermetically enclosed by shrouding an opening of the casing with a metallic cover or lid, whereby the casing is waterproofed (water-sealed) and electromagnetically shielded.

The cooling fin 174 is a section provided so as to protrude perpendicularly in a downward direction from both lateral ends of the base unit lower face 175 of the heat release base 170. The cooling fin 174, an L-shaped plate member in cross section, is provided over entire longitudinal length of the base unit of the heat release base 170. A plurality of screw insertion holes 179 are formed in a side wall of the cooling fin 174. The screw insertion holes 179 are round through-holes extending through the side wall of the cooling fin 174 in a lateral direction thereof, and these holes are provided to insert screws from the side wall of the cooling fin 174 into a region surrounded thereby.

The electric circuit device 110 is inserted from the lower face 175 into the electric circuit device insertion section 172 and then insert-molded with the highly heat-conductive resin 200. The electric circuit device 110 is positioned using the second molded section 152. That is to say, since a dimension of the second molded section 152 in a thickness direction thereof is larger than the lateral dimension of the electric circuit device 110, when the electric circuit device 110 is inserted from the lower face 175 into the electric circuit device insertion section 172, the second molded section 152 abuts the lower face 175 and functions as a stopper.

The highly heat-conductive resin 200 has high thermal conductivity and an excellent electrical insulating property, and this resin is a mixture formed by, for example, impregnating epoxy resin with silica. The kind of substance with which to impregnate a resin agent such as epoxy resin can be alumina, aluminum nitride, boron nitride, or the like, instead of silica. The clearance between the first principal plane of the first molded section 151 and one side wall 176, the clearance between the second principal plane of the first molded section 151 and the other side wall 176, the clearance between the lower-stage step surface of the second molded section 152 and the lower face 175, and internal spaces of the resin gates 177 are filled in with the highly heat-conductive resin 200 that has been poured via the resin gates 177. Also, portions of the electric circuit device 110 exposed from the base unit upper face 173 of the heat release base 170 (i.e., the exposed portion at the first longitudinal side of the first molded section 151, a portion of the lead wire 122, and portions of the G-wires 160, 162 and S-wires 161, 163) are covered with the highly heat-conductive resin 200 so that a range of packaging therewith is dimensionally greater than the opening in the electric circuit device insertion section 172. Thus, the electric circuit device 110 is fixed in an electrically insulated condition to the base unit of the heat release base 170. Additionally, the heat release planes of the electric circuit device 110 (namely, the principal plane side of the heat-releasing section 121, the second principal plane side of the heat-releasing section 131, 141 each, and that of the lead wire 122) are thermally connected in an electrically insulated condition to the side wall 176.

According to the present embodiment, since the heat release planes of the electric circuit device 110 (namely, the principal plane side of the heat-releasing section 121, the second principal plane side of the heat-releasing section 131, 141 each, and that of the lead wire 122) are thermally connected in an electrically insulated condition to the side wall 176, heat from both sides of the electric circuit device 110 is transferred to the side wall 176 via the highly heat-conductive resin 200 and then further transferred from the side wall 176 to the coolant flowing into the cooling medium flow channels 171. According to the present embodiment, since both sides of each semiconductor chip inside the electric circuit device 110 can thus be cooled, cooling performance thereof can be improved and the electric circuit device 110 itself can be constructed using smaller semiconductor chips. According to the present embodiment, therefore, it is possible to miniaturize the electric circuit device 110 and thus to miniaturize the semiconductor module 101 in which the electric circuit device 110 is to be mounted.

At a lower section of the region surrounded by the cooling fin 174 is disposed the capacitor device 102, at an upper section of which (i.e., an upper section close to the lower face 175) are disposed the lead terminals 133, 143 extending from the second longitudinal side of the second molded section 121, towards the capacitor device 102. The capacitor device 102 and the lead terminals 133, 143 are electrically connected so as to match the polarities of the capacitor device 102 and those of the lead terminals 133, 143.

The capacitor device 102 includes a capacitor block 180, a connection member 183, a positive-polarity capacitor terminal 181, a negative-polarity capacitor terminal 182, and an electrical insulating sheet 184. The positive-polarity capacitor terminal 181 and the negative-polarity capacitor terminal 182 are both formed using a flat-plate conductor made of a metal such as a copper alloy or copper excellent in thermal conductivity and in electrical conductivity. The connection member 183 is formed of an insulating member. Polybutylene telephthalate (PBT), for example, is used as the insulating member.

Hereinafter, in the present embodiment, the capacitor block 180 is referred to as the C-block 180, the positive-polarity capacitor terminal 181 as the PC terminal 181, and the negative-polarity capacitor terminal 182 as the NC terminal 182.

The C-block 180 is a block structure of a rectangular solid shape, having a capacitor element in a casing. A longitudinal dimension of the C-block 180 is the same as that of the heat release base 170. The C-block 180 has a lateral dimension that allows the C-block to lie properly in an internal space of the cooling fin 174. Both lateral sides of the C-block 180 abut on an inner surface of the side wall of the cooling fin 174. This arrangement causes the C-block 180 and the cooling medium flow channels 171 to be thermally connected via the heat release base 170. Heat from the C-block 180 is transferred to the base unit of the heat release base 170 via the cooling fin 174 and then further transferred from the base unit to the coolant flowing into the cooling medium flow channels 171.

A terminal unit that includes the PC terminal 181, the NC terminal 182, and the insulating sheet 184, is disposed on an upper face of the C-block 180. In terminal unit having the PC terminal 181 and the NC terminal 182 arranged in stacked form in the lateral direction with the insulating sheet 184 positioned between both, the PC terminal 181 and the NC terminal 182 protrude perpendicularly from a lateral central section of the C-block 180, towards the lower face 175, and extend in parallel in the longitudinal direction in association with the lead terminal 133, 144. The PC terminal 181 and NC terminal 182, after protruding, are both bent outward (towards the opposite side to the sandwiching side of the insulating sheet 184) in the respective lateral directions at right angles and then extend straightly. The PC terminal 181 and the NC terminal 182 are further bent at right angles towards the lower face 175, then extend straightly, and face in the lateral direction in a longitudinally parallel condition via a spatial section. The insulating sheet 184, after protruding, further extends straightly towards the lower face 175 and leads to a position closer thereto than to bends of the PC terminal 181 and the NC terminal 182.

A screw hole 187 is formed in the PC terminal 181. A screw hole 188 is formed in the NC terminal 182. The screw hole 187 is a through-hole penetrating a terminal surface of the PC terminal 181 in a lateral direction thereof, and when the PC terminal 181 and the lead terminal 133 are connected, a position of an opening in the PC terminal 181 matches a position of an opening of the screw hole 135 in the lead terminal 133. The screw hole 188 is a through-hole extending through a terminal surface of the NC terminal 182 in a lateral direction thereof, and when the NC terminal 182 is connected with the lead terminal 143, a position of an opening in the NC terminal 182 matches a position of an opening of the screw hole 146 in the lead terminal 143. For this reason, the screw hole 187 in the PC terminal 181 and the screw hole 188 in the NC terminal 182 are alternately arranged in the longitudinal direction.

The connection member 183 is disposed in the space formed between the PC terminal 181 and the NC terminal 182. The connection member 183 is a block structure of a polyhedral solid shape, held in a sandwiched condition between the PC terminal 181 and the NC terminal 182 from both lateral sides thereof. The connection member 183 is used as an electrical insulating member between the PC terminal 181 and the NC terminal 182, and as a connection member between the PC terminal 181, the NC terminal 182, and the lead terminal 133, 144. The block structure forming the connection member is formed up of a convex protrusion 186 disposed on the plane facing in the same direction as that of the lower face 175 of the rectangular solid, and a concave groove 185 disposed at the side of the capacitor block 180 of a rectangular solid shape. The protrusion 186 and the groove 185 are continuously provided in the longitudinal direction. A nut-containing portion 119 is formed at both sides in the lateral direction of the block structure which forms the connection member 183. The nut-containing portions 119 are each a bottomed hexagonal hole opened from the lateral direction of the block structure, at both lateral sides thereof. When the connection member 183 is inserted into the space between the PC terminal 181 and the NC terminal 182, a position of the above opening matches a position of the open screw hole 187, 188. For this reason, the nut-containing portion 119 at one side in the lateral direction of the connection member 183, and the nut-containing portion 119 at the other side in the lateral direction are arranged in an offset condition in the longitudinal direction. Each nut-containing portion 119 contains a nut 189.

Prior to electrical connection between the PC terminal 181 and NC terminal 182 of the capacitor device 102 and the lead terminals 133, 143, respectively, of the semiconductor module 101, the connection member 183 is inserted into the space between the PC terminal 181 and the NC terminal 182 first. At this time, the lower face 175 of the insulating sheet 184 is engaged with the groove 185 of the connection member 183. Next, the capacitor device 102 under the above state is inserted from the space at the lower face 175 into the region formed around the cooling fin 174. The terminal unit that includes the PC terminal 181, the NC terminal 182, and the connection member 183, is then sandwiched between the lead terminals 133, 143 from both sides in the lateral direction. At this time, the lateral outer faces of the PC terminal 181 abut the first principal planes of each lead terminal 133, and the lateral outer faces of the NC terminal 182 abut the second principal planes of each lead terminal 143. That is to say, the terminals of the same polarity are interconnected. During the above insertion, the protrusion 186 of the connection member 183 is engaged with the groove 153 of the second molded section 152. In addition, longitudinal positions of the screw holes 135, 187 and the nut-containing portion 119 agree with those of the screw holes 146, 188 and the other nut-containing portion 119.

The section where the protrusion 186 of the connection member 183 is engaged with the groove 153 of the second molded section 152 is provided to ensure a creeping distance at an interface of the connecting portion between the connection member 183 and the electric circuit device 110 and thus to prevent electrical discharge. Also, the section where the groove 185 in the connection member 183 and the insulating sheet 184 become engaged with each other is provided to ensure a creeping distance at an interface of the connecting portion between the connection member 183 and the insulating sheet 184 and thus to prevent electrical discharge.

Next, the screw 109 is inserted into the screw hole 135, 187 at one side in the lateral direction via the screw insertion hole 179 in the side wall of the cooling fin 174. Thus, the screw 109 is threadably engaged with the nut 189 contained in the nut-containing portion 119 at one side in the lateral direction. The screw 109 is also inserted into the screw hole 146, 188 at the other side in the lateral direction and threadably engaged with the nut 189 contained in the nut-containing portion 119 at the other side in the lateral direction. The screw insertion hole 179 provided at where it matches the screw hole 135, 187 and the nut-containing portion 119 associated therewith is also provided at where it matches the screw hole 146, 188 and the nut-containing portion 119 associated therewith. Also, the screw insertion hole 179 is larger than those screw holes in diameter. The above connecting operations can therefore be performed easily. Hence, the capacitor device 102 and the semiconductor module 101 can be electrically connected.

According to the present embodiment, the PC terminal 181 and the NC terminal 182 are opposed to each other in parallel, so when a positive current flows through the PC terminal 181 and a negative current equal to the positive current in magnitude and opposite in direction flows through the NC terminal 182, the magnetic field generated by the positive current can be offset by the magnetic field generated by the negative current. Thus, according to the present embodiment, the magnetic field offset effect makes it possible to reduce the line inductance developed between the PC terminal 181 and the NC terminal 182. That is to say, according to the present embodiment, the line inductance shown in FIG. 6 can be reduced.

According to the present embodiment, therefore, since the line inductance 105 in the capacitor device 102 can be reduced, it is possible to further reduce the switching loss of the IGBTs 111 and hence to further reduce the amount of heat generated by the IGBTs 111. According to the present embodiment, therefore, the electric circuit device 110 can be constructed using even smaller semiconductor chips that constitute the IGBTs 111. Thus, according to the present embodiment, the electric circuit device 110 can be miniaturized and the semiconductor module 101 in which to mount the electric circuit device 110 can be correspondingly miniaturized.

The circuit board unit 190 includes a control circuit board 191 and a plurality of electronic components mounted thereon.

The mounted electronic components are a microcomputer 192 that constitutes the foregoing control unit, a driver circuit (IC) 193 that constitutes the foregoing driver, and a current sensor 194 that detects a supply current to the foregoing semiconductor module 101.

The control circuit board 191 is a rectangular flat plate, which is mounted on the base unit and collars of the heat release base 170 via spacers 197. Also, the control circuit board 191 is fixed to the surfaces of the base unit and collars of the heat release base 170 by threadable engagement of screws 195 with screw holes 178.

Three rectangular through-holes 196 extending through in a vertical direction of the control circuit board 191 are formed in line in a longitudinal direction thereof so that each through-hole 196 matches to the mounting position of one electric circuit device 110. The through-hole 196 has an appropriate size such that the control circuit board 191, when mounted on the base unit and collars of the heat release base 170, fits onto the insert-molded electric circuit devices 110. In the present embodiment, the insert-molded electric circuit devices 110 can thus be fixed using the control circuit board 191. That is to say, the control circuit board 191 is used as a fixing jig in the present embodiment.

The microcomputer 192 is mounted at one side in a lateral direction of the through-holes 196 positioned centrally in the longitudinal direction of the control circuit board 191. The driver 193 is provided for each upper arm and each lower arm. The driver 193 is therefore mounted on the control circuit board 191 so as to be disposed at both sides in the lateral direction of each through-hole 196, and near the G-wires 160, 162 and S-wires 161, 163 of each electric circuit device 110 (i.e., at both sides in a longitudinal direction of the through-hole 196). The current sensor 194 is mounted centrally at the through-holes 196 positioned at both longitudinal ends of the control circuit board 191 (i.e., the sensor 194 is mounted at a position associated with the lead wire 122 of each electric circuit device 110). The lead wire 122 of the electric circuit device 110, mounted at both longitudinal ends, extends through a hollow section of the current sensor 194. The electric circuit device 110 and each electronic component are electrically interconnected by a wiring pattern and other wiring members provided on the control circuit board 191. Connection between the electronic components is also established using the wiring pattern and other wiring members.

In the present embodiment, the microcomputer 192 and the driver circuit 193 are mounted on the same board, but both may be mounted on independent boards. In addition, while the control circuit board 191 in the present embodiment is mounted on the heat release base 170 via the spacers 197, the board 191 may be mounted on the heat release base 170 without using the spacers 197. In this case, since the control circuit board 191 and the heat release base 170 are thermally connected, the control circuit board 191 is expected to be cooled.

When the inverter 100 is assembled, each electric circuit device 110 that has been assembled in the manner described above is first insert-molded onto each heat release base 170 and then mounted thereon to construct the semiconductor module 101. Next, as described above, the semiconductor module 101 and the capacitor device 102 are electrically connected. Finally, the control circuit board 191 with mounted electronic components is mounted on the heat release base 170, and thus the inverter 100 is assembled.

As described above, according to the present embodiment, reduction in line inductance and the improvement of cooling performance by both-side cooling can be achieved at the same time. According to the present embodiment, it is thus possible to construct an electric circuit device 110 using semiconductor chips smaller than conventional ones, and hence to make the electric circuit device 110 more compact than conventional ones. The present embodiment, therefore, realizes the miniaturization of the semiconductor module 101 in which to mount the electric circuit device 110, and furthermore, the miniaturization of the inverter 100 in which to mount the semiconductor module 101 itself.

According to the present embodiment, since the electric circuit device 110 is constructed for each arm, that is, on a two-in-one scheme basis, the mounting space of the electric circuit devices 110 in the semiconductor module 101 can also be reduced to achieve further miniaturization of the semiconductor module 101 and the inverter 100.

In the present embodiment, a flow direction of the coolant in the semiconductor module 101, input and output directions of current in the electric circuit device 110, and a heat release direction of the semiconductor chips in the electric circuit device 110 are in an orthogonal relationship to one another.

Second Embodiment

Figure 21:
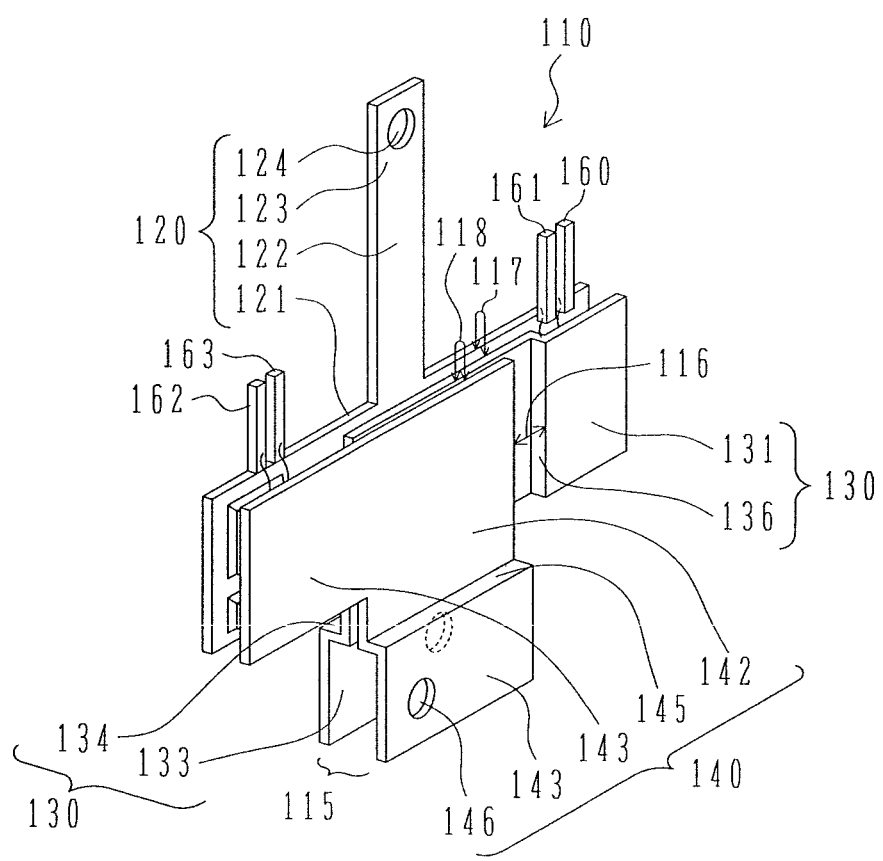
FIG. 21 is a perspective view showing a configuration of an electric circuit device according to a second embodiment of the present invention.

A second embodiment of the present invention will be described per FIG. 21.

The present embodiment, an improvement of the first embodiment, is an example of transposing the configurations of the P-electrode 130 and N-electrode 140 of the first embodiment. The present (second) embodiment differs from the first embodiment in three respects. One is that a configuration of a first bend 136 is added to the P-electrode 130 (however, the first bend 136 differs from the first bend 144 of the first embodiment in terms of position and is opposite in extending direction of a conductor). One is that the configuration of the lead wire 132 is replaced with a configuration of a lead wire 142 in the first embodiment (however, the lead wire 132 is opposite to the lead wire 142 of the first embodiment in terms of extending direction of a conductor). One is that since the first bend is removed from the N-electrode 140, the configuration of the lead wire 142 is replaced with a configuration of a lead wire 132 in the first embodiment (however, the lead wire 142 is opposite to the lead wire 132 of the first embodiment in terms of extending direction of a conductor). Other elements are the same as those of the first embodiment in terms of configuration, so the same reference number or symbol is assigned to the same element, description of which is omitted.

In the present embodiment described above, as in the first embodiment, reduction in line inductance and the improvement of cooling performance by both-side cooling of semiconductor chips can be achieved at the same time and electric circuit devices 110 can be miniaturized.

Third Embodiment

Figure 22:
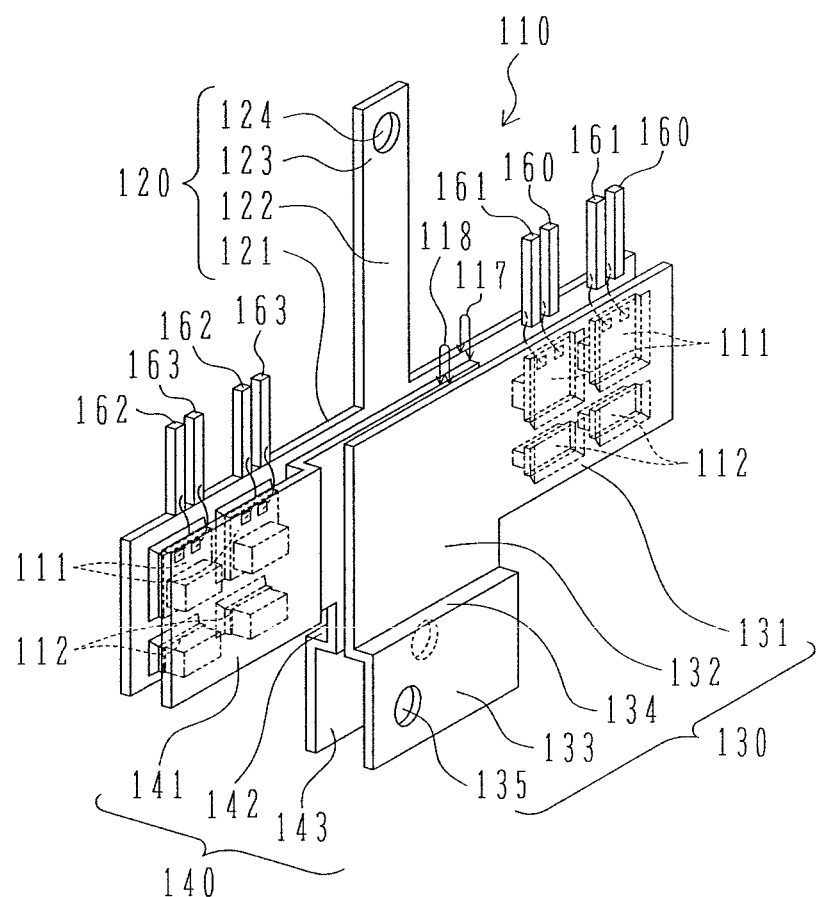
FIG. 22 is a perspective view showing a configuration of an electric circuit device according to a third embodiment of the present invention.

A third embodiment of the present invention will be described per FIG. 22.

The present embodiment, an application of the first embodiment, is an example of connecting arms' IGBTs 111 and diodes 112 in two lines in parallel. In the present (third) embodiment, the same pair of chips as that of HI and HD chips juxtaposed in a short-side direction are juxtaposed in a long-side direction, and the same pair of chips as that of LI and LD chips juxtaposed in a short-side direction are juxtaposed in a long-side direction. Along with these, the number of G-wires 160, 162 and S-wires 161, 163 is also correspondingly increased. In the present embodiment, various electrodes have areas larger than those of the electrodes in the first embodiment. Other elements are the same as those of the first embodiment in terms of configuration, so the same reference number or symbol is assigned to the same element, description of which is omitted.

In the present embodiment described above, as in the first embodiment, reduction in line inductance and the improvement of cooling performance by both-side cooling of semiconductor chips can be achieved at the same time and electric circuit devices 110 can be miniaturized.

According to the present embodiment, since the semiconductor chips are connected in two lines in parallel, each electric circuit device 110 can be increased in current density. In the same perspective, the number of parallel connection lines of the semiconductor chips can be increased to three and further to four, so the electric circuit device 110 can be further increased in current density.

Fourth Embodiment

Figure 23:
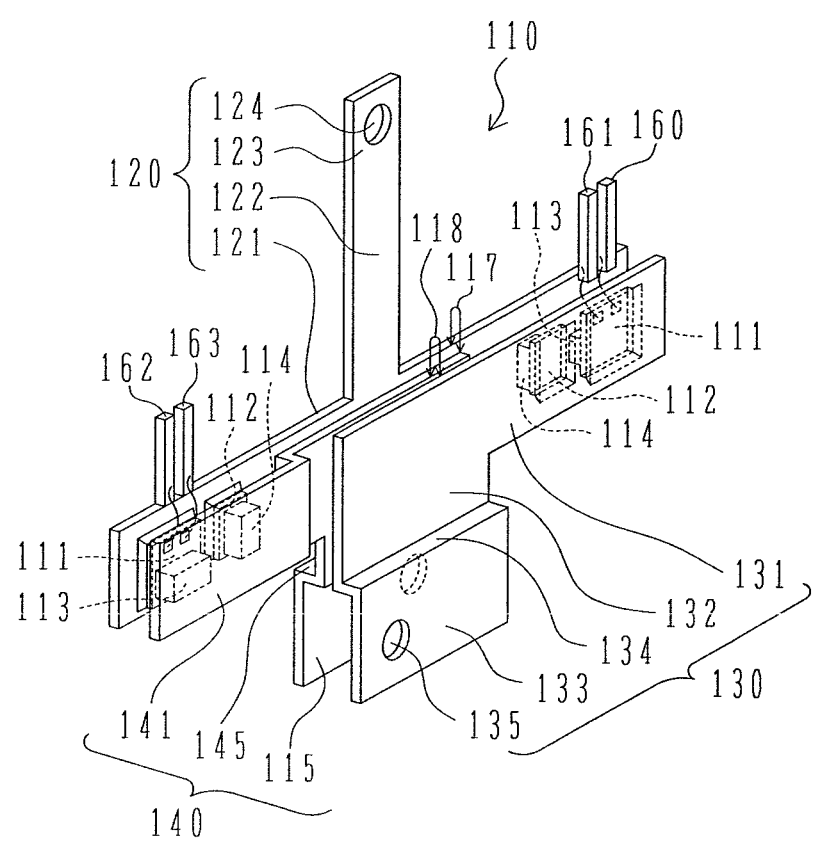
FIG. 23 is a perspective view showing a configuration of an electric circuit device according to a fourth embodiment of the present invention.

A fourth embodiment of the present invention will be described per FIG. 23.

The present embodiment, a modification of the first embodiment, is an example in which the HI and HD chips juxtaposed in the short-side direction in the first embodiment and the LI and LD chips also juxtaposed in the short-side direction in the first embodiment are each juxtaposed in a long-side direction. In the present (fourth) embodiment, the HD and LD chips are arranged more internally to an electric circuit device than the HI and LI chips. In the present embodiment, various electrodes have areas smaller than those of the electrodes in the first embodiment. Other elements are the same as those of the first embodiment in terms of configuration, so the same reference number or symbol is assigned to the same element, description of which is omitted.

In the present embodiment described above, as in the first embodiment, reduction in line inductance and the improvement of cooling performance by both-side cooling of semiconductor chips can be achieved at the same time and electric circuit devices 110 can be miniaturized.

According to the present embodiment, connecting the semiconductor chips in two, three, or four lines in parallel, as in the third embodiment, makes it possible to increase each electric circuit device 110 in current density.

Fifth Embodiment

Figure 24:
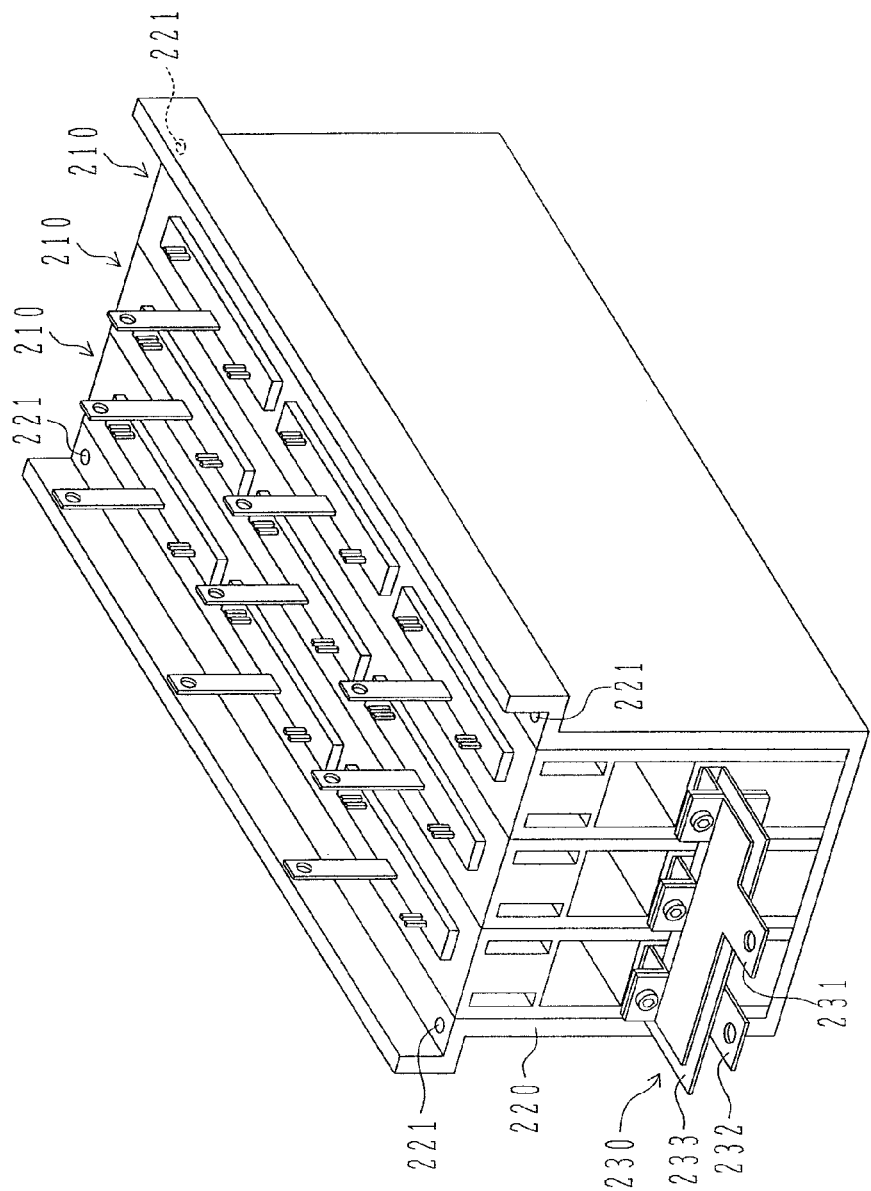
FIG. 24 is a perspective view showing a configuration of an inverter according to a fifth embodiment of the present invention.
Figure 25:
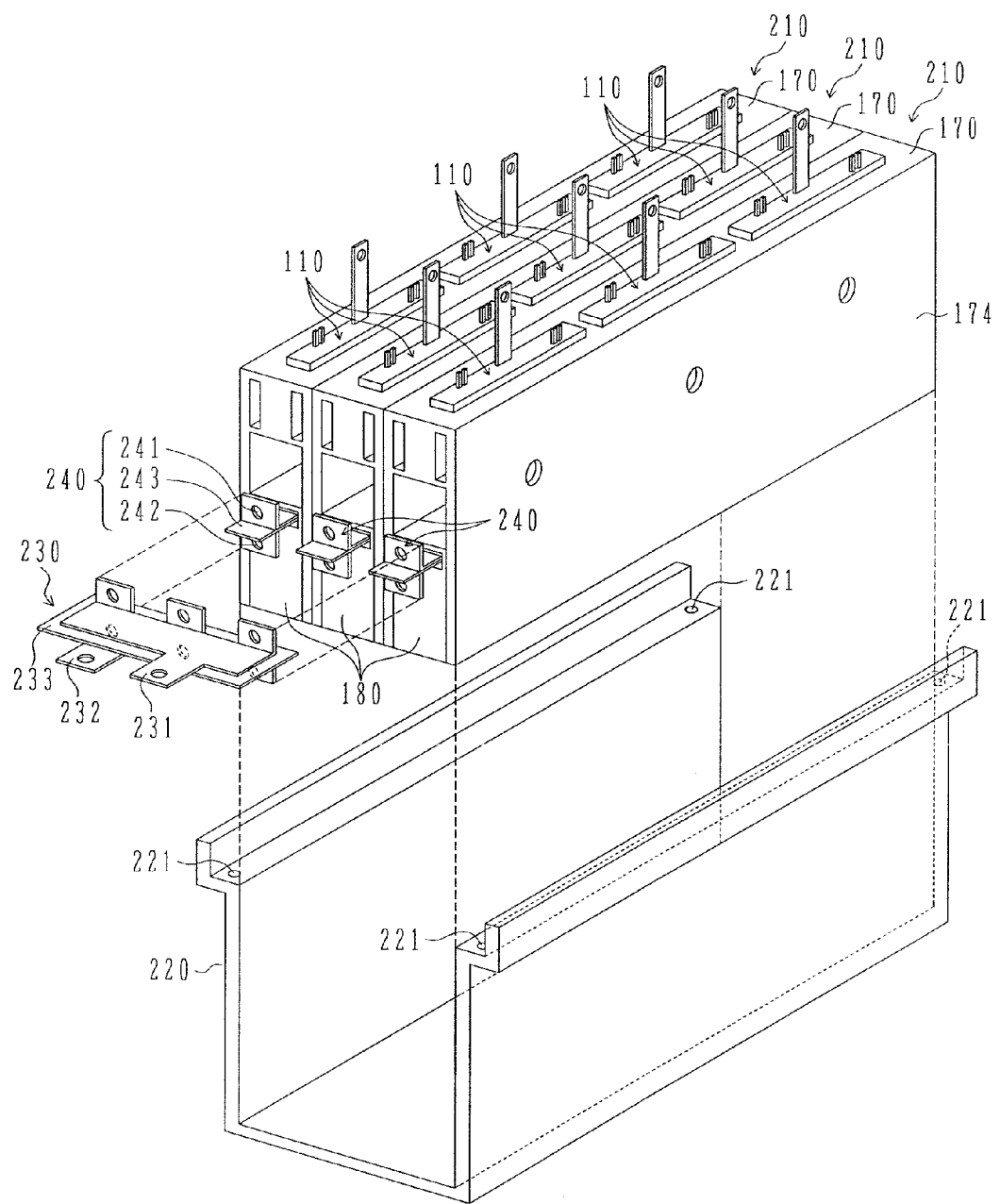
FIG. 25 is an exploded perspective view of FIG. 24.
Figure 26:
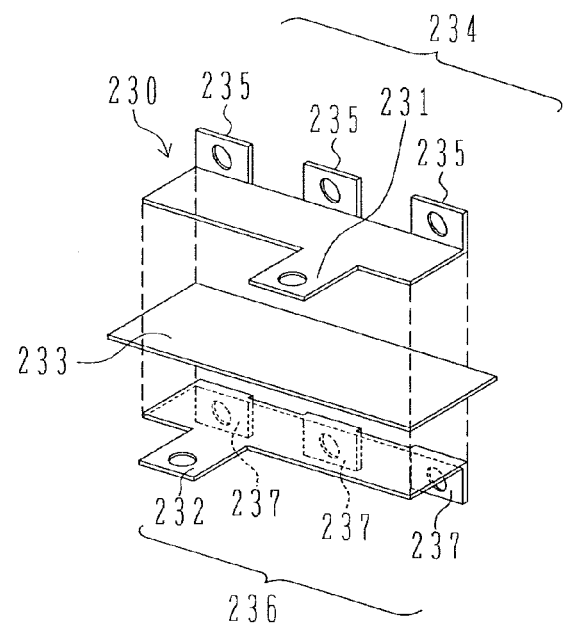
FIG. 26 is an exploded perspective view showing a configuration of an integrated terminal used in the inverter of FIG. 24.

A fifth embodiment of the present invention will be described per FIGS. 24 to 26.

The present embodiment, another application of the first embodiment, is an example in which the semiconductor module 101 and capacitor device 102 in the first embodiment are connected together to form a basic unit 210 and multiple basic units 210 are arranged next to one another in a short-side direction. In the present (fifth) embodiment, three basic units 210 are juxtaposed for mutual contact between cooling fins 174 and are stored in a main unit casing 220. Heat release bases 170 have no collars and are of lateral thickness smaller than in the first embodiment. C-blocks 180 also are of lateral thickness smaller than in the first embodiment. Other elements are the same as those of the first embodiment in terms of configuration, so the same reference number or symbol is assigned to the same element, description of which is omitted.

A unit terminal 240 is electrically connected to the C-block 180 (PC terminal and NC terminal) of each basic unit 210. The unit terminal 240 protrudes in a longitudinal direction from a region formed between the cooling fins 174 of any two basic units 210. The unit terminal 240 includes a positive-polarity terminal 241, a negative-polarity terminal 242, and an insulating sheet 243. The positive-polarity terminal 241 and the negative-polarity terminal 242 are stacked vertically with the insulating sheet 243 sandwiched between both, and are opposed in proximity and in parallel to each other. After front ends of the positive-polarity terminal 241 and the negative-polarity terminal 242 have protruded longitudinally from the region formed between the cooling fins 174, one of the front ends is bent at right angles outward in a vertical direction and then extends straightly, whereas the other front end is bent at right angles outward in a vertical direction and then extends straightly. A screw hole is formed at the respective front ends of the positive-polarity terminal 241 and the negative-polarity terminal 242.

The unit terminals 240 are integratedly interconnected via an integrated terminal 230. The integrated terminal 230 includes a positive-polarity electrode 234, a negative-polarity electrode 236, and an insulating sheet 233. The positive-polarity electrode 234 and the negative-polarity electrode 236 are stacked vertically with the insulating sheet 233 sandwiched between both, and are opposed in proximity and in parallel to each other. Also, the positive-polarity electrode 234 and the negative-polarity electrode 236 both have a rectangular flat-plate laminate. A terminal 231 extending straightly towards one longitudinal side of the flat-plate laminate of the positive-polarity electrode 234 is formed at the particular longitudinal side, and three terminals 235 each bent at right angles towards one vertical side from the other longitudinal side and extending straightly is formed at the particular other longitudinal side. A terminal 232 extending straightly towards one longitudinal side of the flat-plate laminate of the negative-polarity electrode 236 is formed at the particular longitudinal side, and three terminals 237 each bent at right angles towards the other vertical side from the other longitudinal side and extending straightly is formed at the particular other longitudinal side. A screw hole is formed at the respective front ends of the terminals 231, 233 and terminals 235, 237.

The front end of the positive-polarity terminal 241 of the unit terminal 240 and a terminal 235 abut each other in an opposed condition and are screw-connected. The front end of the negative-polarity terminal 242 of the unit terminal 240 and a terminal 237 abut each other in an opposed condition and are screw-connected. Thus, the C-blocks (PC terminals and NC terminals) of the same polarity are integratedly connected. The integrated electrode 230 is constructed so that current paths from the terminals 231, 232 to the associated C-blocks 180 are equal in length.

The lead terminals 123 of each basic unit 210 are also integratedly connected for equal length of current paths on a phase-by-phase basis.

Since screw holes 221 are formed in the main unit casing 220, the control circuit board with mounted electronic components can be mounted, as in the first embodiment.

The electric circuit devices 110 in the first embodiment may be replaced with those of any one of the second to fourth embodiments.

According to the present embodiment described above, since the multiple basic units 210 are integratedly connected using the integrated terminal 230, reduction in line inductance and the improvement of cooling performance by both-side cooling of the semiconductor chips can be simultaneously achieved, as in the first embodiment. In addition, the electric circuit devices 110 can be made more compact and thus an inverter 100 of a larger capacity can be realized.

According to the present embodiment, since the integrated terminal 230 is constructed for equal length of the current paths extending from the terminals 231, 232 to the C-blocks 180, line inductance from the unit terminal 240 to the electric circuit device 110 can be well matched between the basic units 210.

Sixth Embodiment

Figure 27:
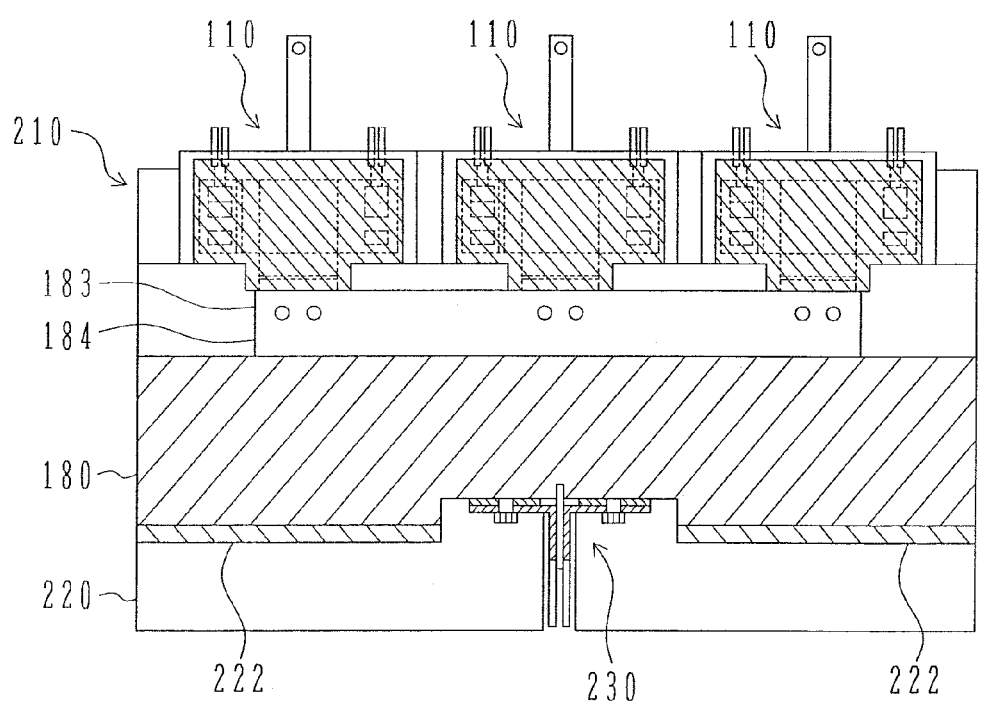
FIG. 27 is a perspective view showing a configuration of an inverter according to a sixth embodiment of the present invention.
Figure 28:
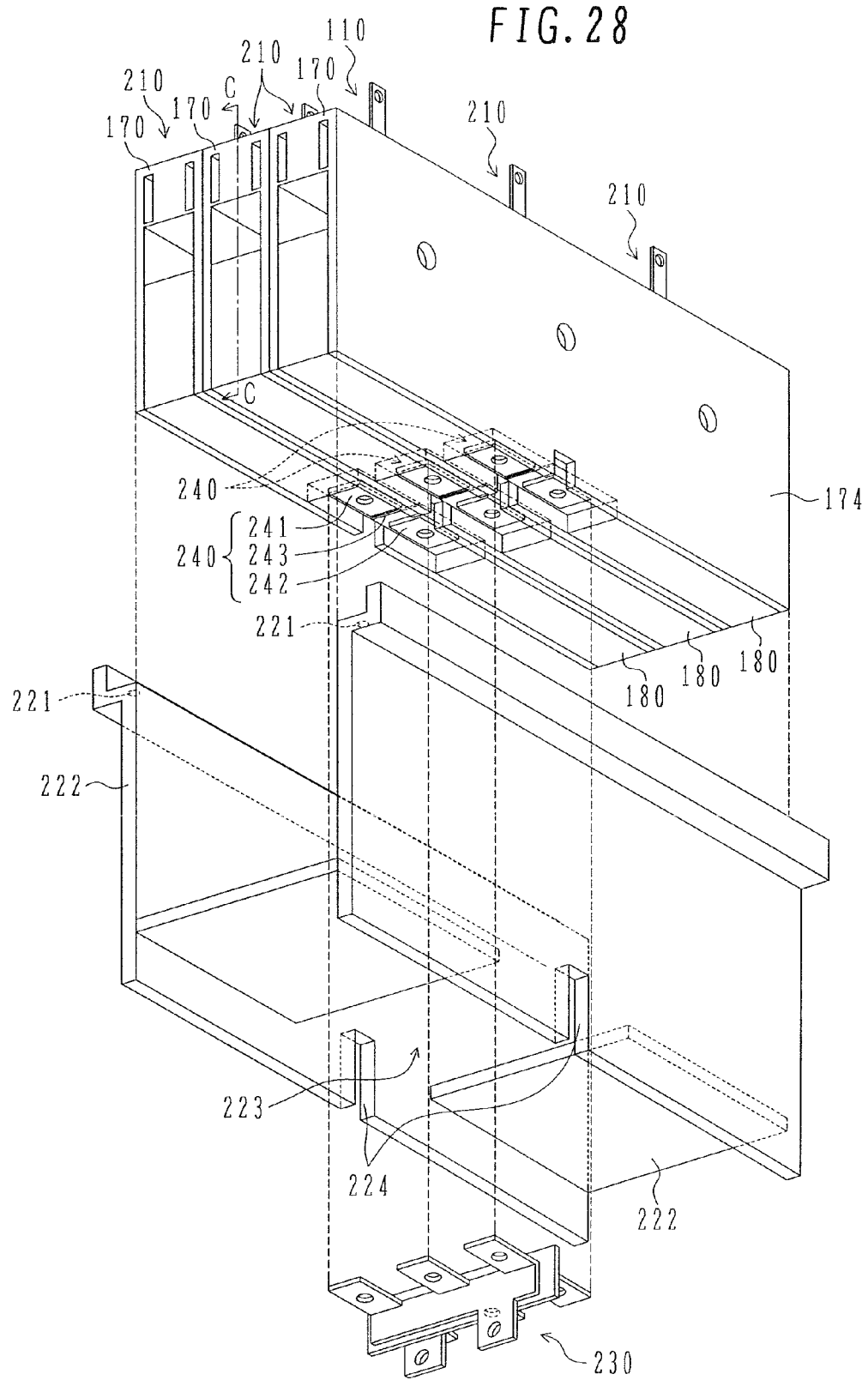
FIG. 28 is an exploded view of FIG. 27.
Figure 29:
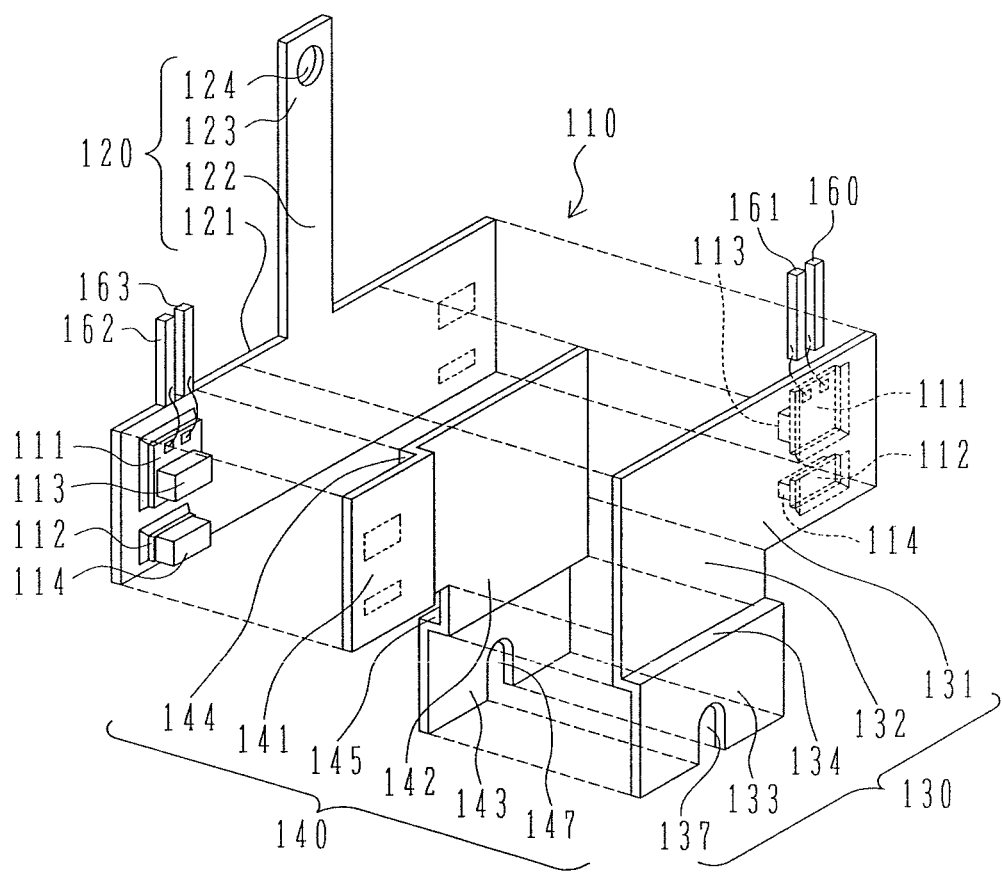
FIG. 29 is an exploded perspective view showing a configuration of an electric circuit device according to a seventh embodiment of the present invention.
Figure 30:
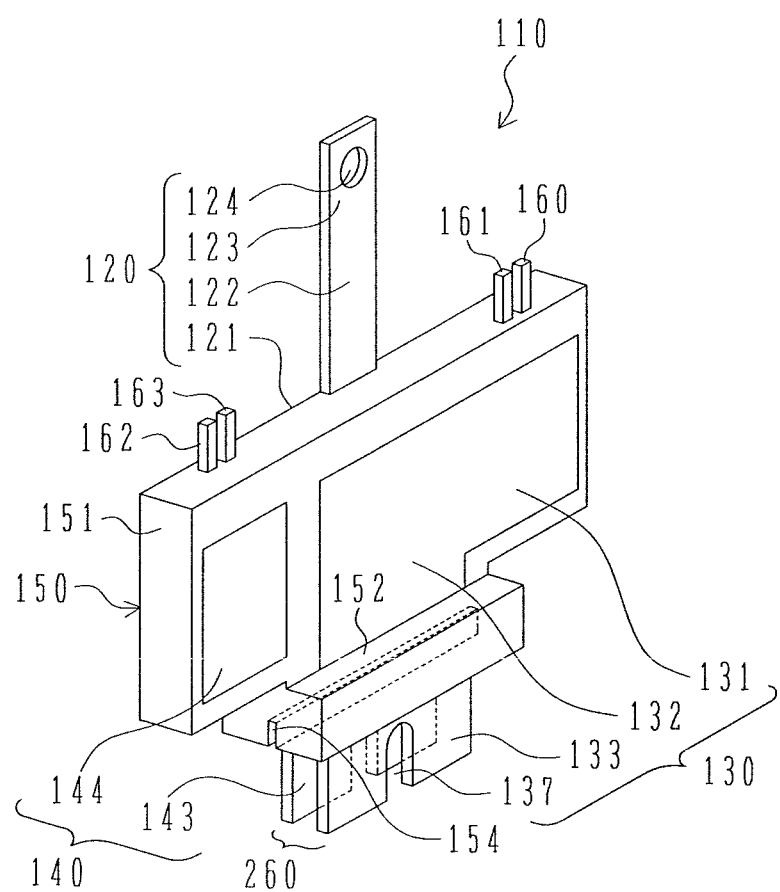
FIG. 30 is a perspective view showing an external configuration of the electric circuit device according to the seventh embodiment of the present invention.
Figure 31:
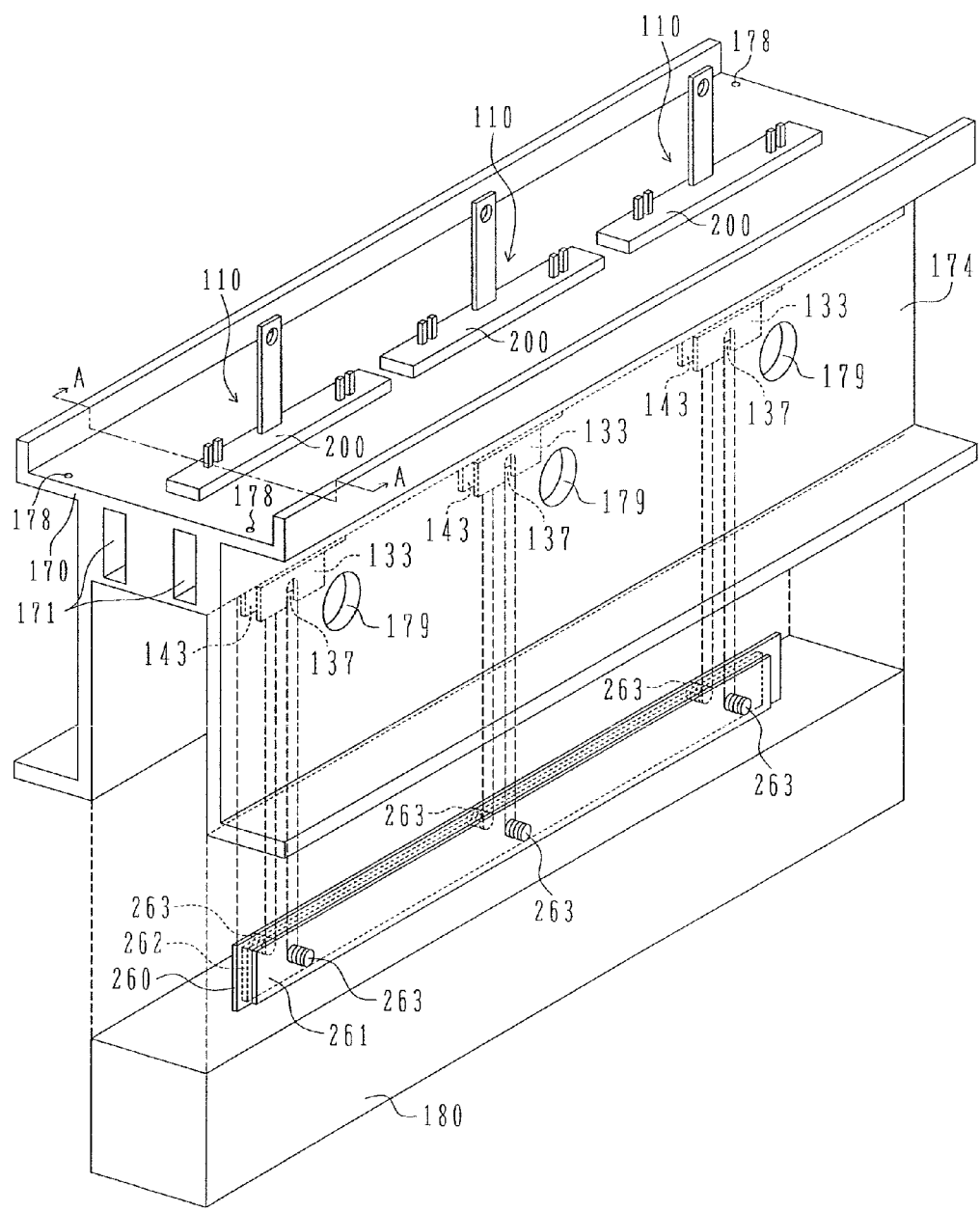
FIG. 31 is an exploded perspective view showing an inverter configuration according to the seventh embodiment of the present invention.
Figure 32:
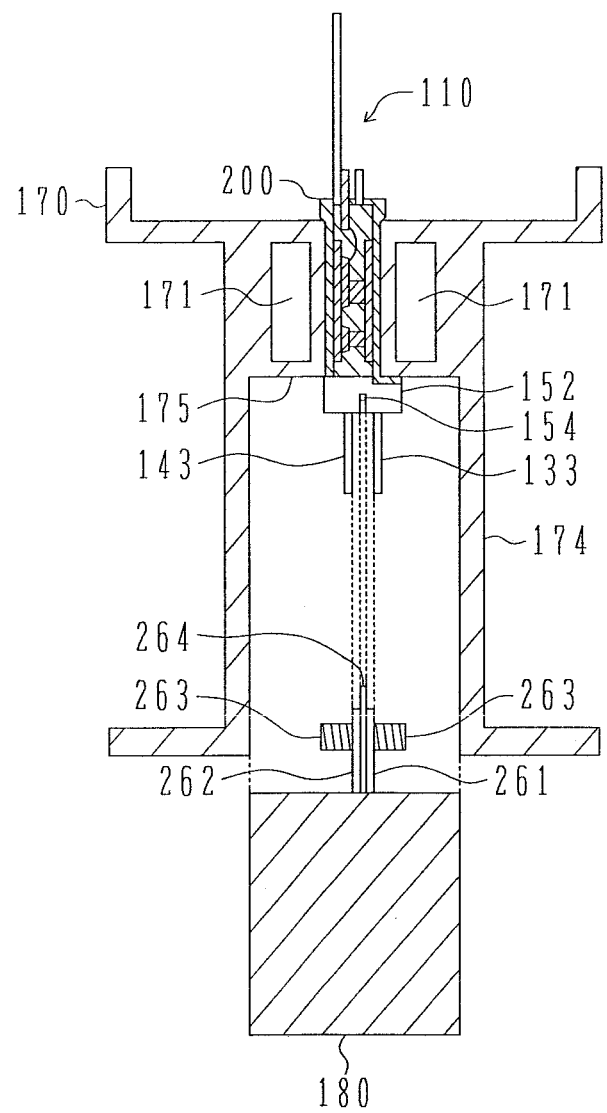
FIG. 32 is a cross-sectional view taken along the line A-A' of FIG. 31.
Figure 33:
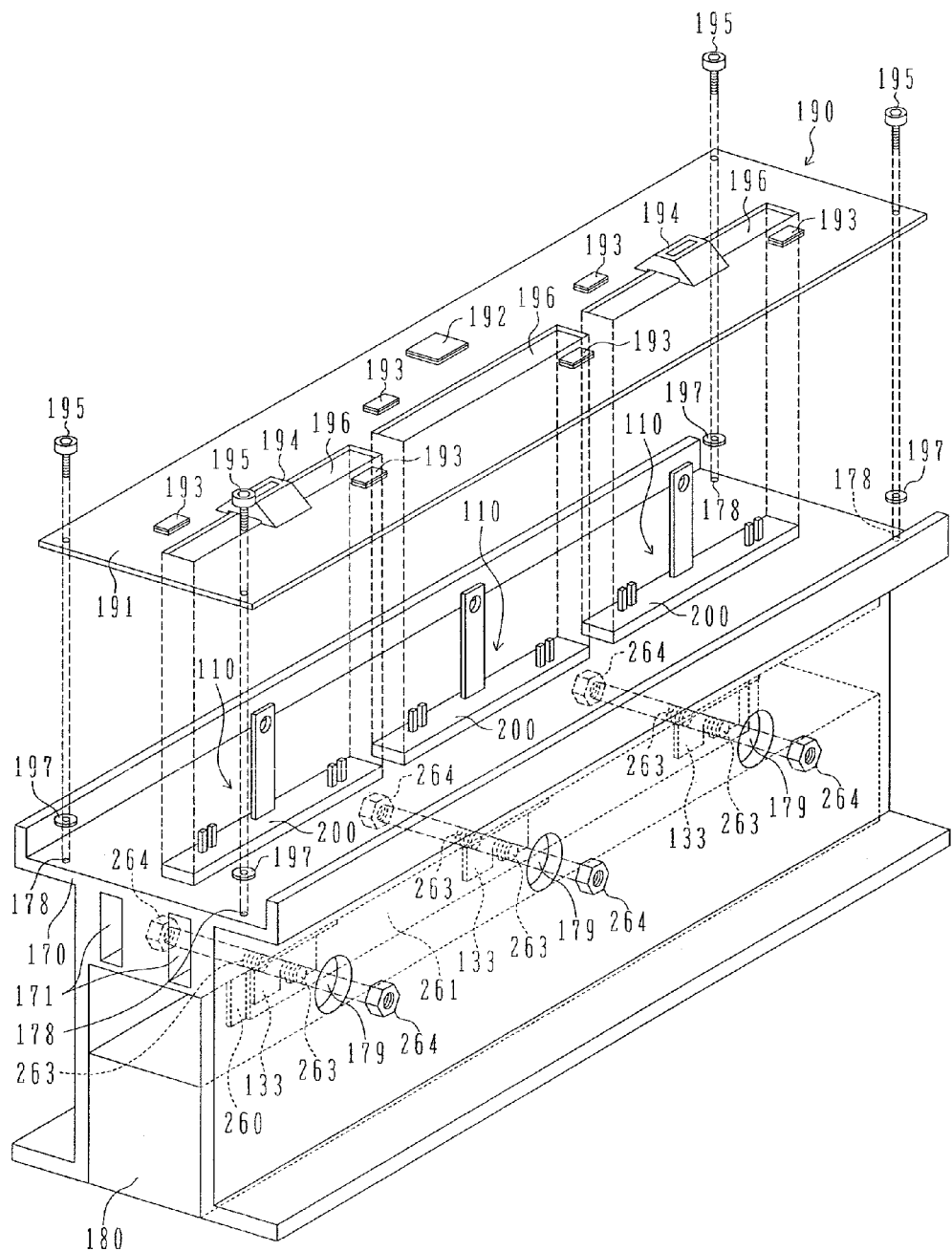
FIG. 33 is an exploded perspective view showing another configuration of the electric circuit device according to the seventh embodiment of the present invention.

A sixth embodiment of the present invention will be described based on FIGS. 27 and 28.

The present embodiment, a modification of the fifth embodiment, is an example in which the unit terminal 240 is provided at the bottom of the C-block 180. For this reason, an opening 113 for exposing the unit terminal 240 is formed centrally at the bottom of the main unit casing 220 in a lateral direction thereof. The unit terminal 240 is essentially of the same configuration as in the fifth embodiment, except that the unit terminal 240 is rotationally moved through 90 degrees in a vertical direction of the terminal from a longitudinal direction thereof. The integrated terminal 230 also has the same configuration as in the fifth embodiment.

According to the present embodiment described above, since the multiple basic units 210 are integratedly connected using the integrated terminal 230, reduction in line inductance and the improvement of cooling performance by both-side cooling of the semiconductor chips can be simultaneously achieved, as in the first embodiment. In addition, the electric circuit devices 110 can be made more compact and thus an inverter 100 of a larger capacity can be realized.

According to the present embodiment, since the integrated terminal 230 is constructed for equal length of the current paths extending from the terminals 231, 232 to the C-blocks 180, line inductance from the unit terminal 240 to the electric circuit device 110 can be well matched between the basic units 210.

Seventh Embodiment

A seventh embodiment of the present invention will be described based on FIGS. 29 to 33.

The present embodiment, another modification of the first embodiment, is an example in which the screw holes in the lead terminals 133, 143 are formed as insertion portions 137, 147 for welded bolts. For this reason, the C-block 180 has terminals stacked in a longitudinal direction with an insulating sheet 260 sandwiched between an PC terminal 261 and an NC terminal 262. The PC terminal 261 and the NC terminal 262 have the welded bolts instead of screw holes. A concave groove 154 for engaging an insulating sheet 264 therewith is formed at the bottom of the second molded section 152. Clearance 260 between the lead terminals 133, 143 is smaller than in the first embodiment.

The groove 154 is provided to ensure a creeping distance at an interface of the connecting portion between the insulating sheet 264 and the electric circuit device 100 and thus to prevent electrical discharge.

In the present embodiment, the lead terminal 133, 143 is used to engage the welded-bolt insertion portion 137, 147 and the welded bolt 263 such that the terminals of the C-block 180 are sandwiched from both sides in the lateral direction. Also, a nut 264 is threadably engaged with the welded bolt 263 in that state. Thus, the lead terminal 133 and the lead terminal 143 abut on the P terminal 261 and the NC terminal 262, respectively, and are linked together.

According to the present embodiment described above, the positive side and negative side at the connection between the lead terminal 133, 143 and an associated terminal of the C-block 180 can be made closer to each other than in the first embodiment. Also, currents that flow through the positive and negative sides can be completely opposed with equal magnitude and opposite directionality. According to the present embodiment, therefore, line inductance can be reduced more significantly than in the first embodiment.

Eighth Embodiment

Figure 34:
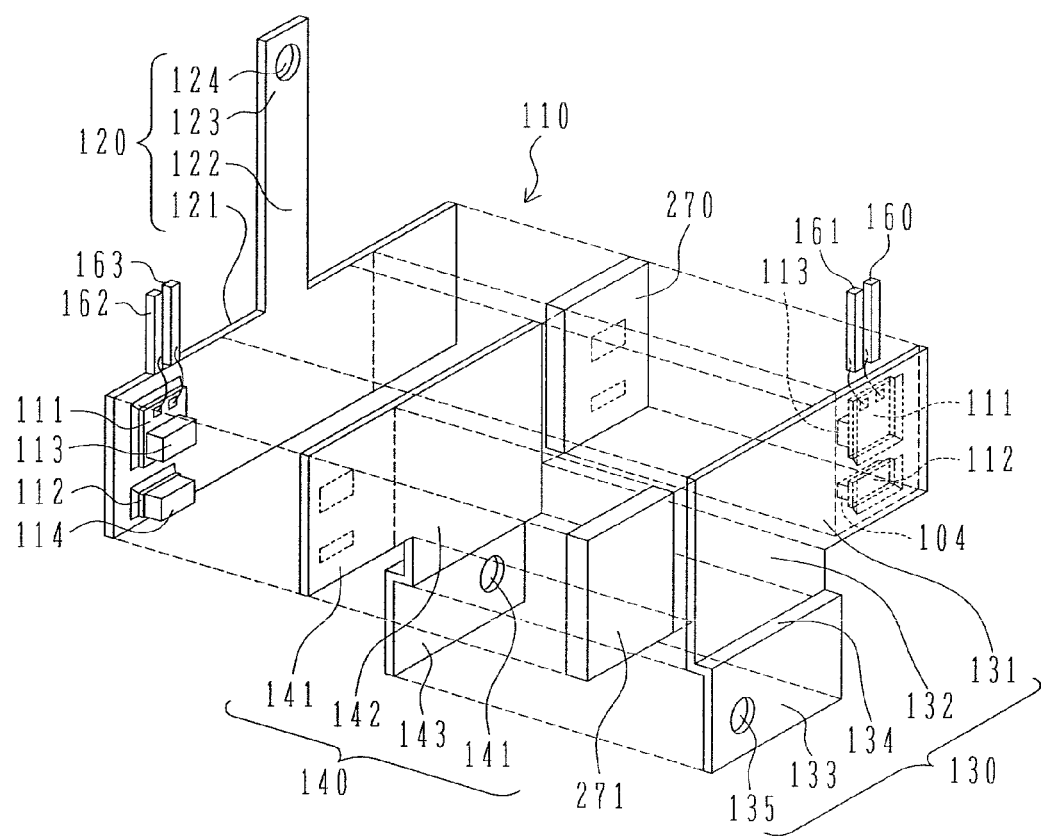
FIG. 34 is an exploded perspective view showing a configuration of an electric circuit device according to an eighth embodiment of the present invention.
Figure 35:
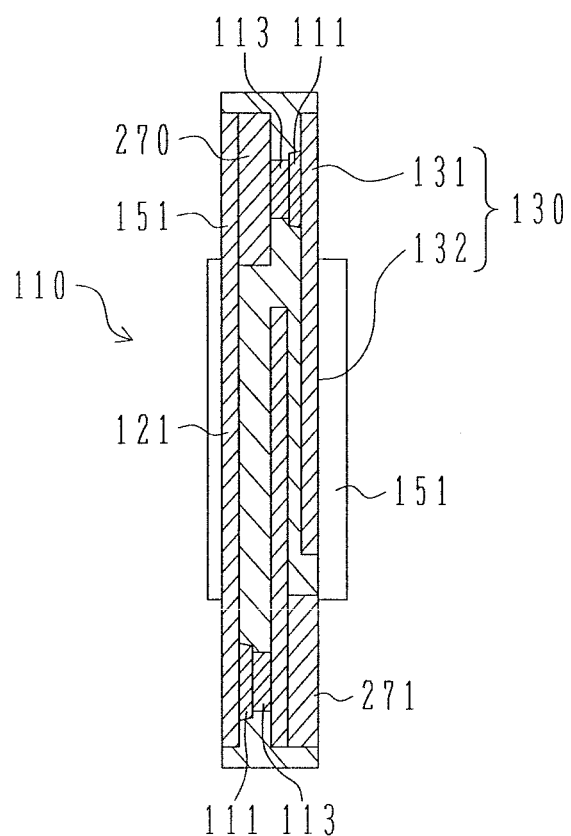
FIG. 35 is a cross-sectional view showing the configuration of the electric circuit device according to the eighth embodiment of the present invention.

An eighth embodiment of the present invention will be described per FIGS. 34 and 35.

The present embodiment, yet another modification of the first embodiment, is an example in which both-side cooling and line inductance reduction can be achieved at the same time without using the first bend 144 of the N-electrode 140. For this reason, the present embodiment provides metallic spacers 270 and 271 of a rectangular flat-plate shape that are made of copper excellent in electrical conductivity and in thermal conductivity. The metallic spacer 270 is connected between the chip surface at the emitter electrode side of an HI chip, the chip surface at the anodic electrode side of an HD chip, and the mounting surface of the heat-releasing section 121, and the metallic spacer 271 is mounted on the heat release plane of the heat-releasing section 141.

The heat-releasing section 141 is disposed on the same plane as that of the lead wire 142. Therefore, the heat release plane of the heat-releasing section 141 cannot be exposed at the second principal plane of the first molded section 151. Instead, a second principal plane of the metallic spacer 271 serves as the heat release plane of the heat-releasing section 141 and is exposed at the surface of the second principal plane of the first molded section 151.

The metallic spacer 270 may be disposed integrally with the M-electrode 120.

In the present embodiment described above, as in the first embodiment, reduction in line inductance and the improvement of cooling performance by both-side cooling of semiconductor chips can be achieved at the same time and electric circuit devices 110 can be miniaturized.

According to the present embodiment, connecting the semiconductor chips in two, three, or four lines in parallel, as in the third embodiment, makes it possible to increase each electric circuit device 110 in current density.

What is claimed is:

1. A power convertor comprising:
a first semiconductor chip constituting an upper arm;
a second semiconductor chip constituting a lower arm;
a capacitor device supplying DC power to the first semiconductor chip and the second semiconductor chip;
a P-electrode comprising a first lead wire connected to the first semiconductor chip and a first lead terminal connected to a positive-polarity capacitor terminal of the capacitor device;
a N-electrode comprising a second lead wire connected to the second semiconductor chip and a second lead terminal connected to a negative-polarity capacitor terminal of the capacitor device; and
a M-electrode connecting the first semiconductor chip with the second semiconductor chip;
wherein the first semiconductor chip, the second semiconductor chip, the capacitor device, the P-electrode, the N-electrode, and the M-electrode constitute a closed circuit,
the first lead terminal and the second lead terminal are laminated and disposed with a connection member sandwiched between the first lead terminal and the second lead terminal, and
the P-electrode, the first semiconductor chip, the M-electrode, the second semiconductor chip, and the N-electrode are laminated and disposed so that adjacent currents flow through the first lead wire, the M-electrode, and the second lead wire respectively in opposite directions to each other if a closed current flows through the closed circuit.

2. A power converter according to claim 1, wherein
the first semiconductor chip comprises a first IGBT and a first diode,
the second semiconductor chip comprises a second IGBT and a second diode,
a first gate wire connected to the first IGBT is disposed to protrude in the opposite direction to the protruding direction of the first lead terminal, and
a second gate wire connected to the second IGBT is disposed to protrude in the opposite direction to the protruding direction of the second lead terminal.

3. A power converter according to claim 1, wherein
the connection member includes a first nut, and
the second lead terminal is fixed to the connection member by a first screw connected to the first nut.

4. A power converter according to claim 1, wherein
an electric circuit device comprises the first semiconductor chip, the second semiconductor chip, a first heat release section and a second heat release section facing the first heat release section with the first semiconductor chip and the second semiconductor chip disposed between the first heat release section and the second heat release section,
the first lead terminal and the second lead terminal are connected to a first surface of the electric circuit device facing capacitor device, and
the electric circuit device has an alternating current side terminal connected to a second surface which is different from the first surface of the electric circuit device.

5. A power converter according to claim 1, further comprising molded material sealing the first semiconductor chip, the second semiconductor chip, the first lead wire, and the second lead wire.

6. A power converter according to claim 3, wherein
the connection member includes a second nut, and
the first lead terminal is fixed to the connection member by a second screw connected to the second nut.

* * * * *